(12) United States Patent
Futamura et al.

(10) Patent No.: US 11,521,917 B2
(45) Date of Patent: Dec. 6, 2022

(54) SEMICONDUCTOR DEVICE

(71) Applicant: ROHM CO., LTD., Kyoto (JP)

(72) Inventors: Yosui Futamura, Kyoto (JP);
Masahiko Nakamura, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 15 days.

(21) Appl. No.: 16/880,619

(22) Filed: May 21, 2020

(65) Prior Publication Data
US 2020/0373227 A1 Nov. 26, 2020

(30) Foreign Application Priority Data

May 23, 2019 (JP) .............................. JP2019-097152
Apr. 14, 2020 (JP) .............................. JP2020-072411

(51) Int. Cl.
*H01L 23/495* (2006.01)
*H01L 29/78* (2006.01)
*H01L 23/00* (2006.01)
*H01L 21/306* (2006.01)
*H01L 29/66* (2006.01)

(52) U.S. Cl.
CPC .... *H01L 23/4951* (2013.01); *H01L 21/30604* (2013.01); *H01L 21/30625* (2013.01); *H01L 23/49562* (2013.01); *H01L 24/32* (2013.01); *H01L 24/48* (2013.01); *H01L 24/73* (2013.01); *H01L 29/66712* (2013.01); *H01L 29/7813* (2013.01); *H01L 2224/32245* (2013.01); *H01L 2224/48091* (2013.01); *H01L 2224/48247* (2013.01); *H01L 2224/73265* (2013.01)

(58) Field of Classification Search
CPC ........... H01L 23/4951; H01L 23/49562; H01L 29/7813; H01L 24/48; H01L 24/73; H01L 24/32; H01L 21/30625; H01L 21/30604; H01L 29/66712; H01L 2224/32245; H01L 2224/48091; H01L 2224/48247; H01L 2224/73265; H01L 29/1095; H01L 29/41741; H01L 24/00; H01L 2221/68327; H01L 2221/6834; H01L 21/6836; H01L 23/3107; H01L 29/7811; H01L 29/7815; H01L 29/407; H01L 29/42376; H01L 29/0696; H01L 29/0657; H01L 23/49513; H01L 2224/0603
USPC ......................................................... 257/676
See application file for complete search history.

(56) References Cited

U.S. PATENT DOCUMENTS

| | | | | |
|---|---|---|---|---|
| 7,397,128 B2 * | 7/2008 | Kubo | ................ | H01L 29/66272 257/774 |
| 8,716,741 B2 * | 5/2014 | Kashimura | .......... | H05K 3/3442 257/99 |
| 9,362,366 B2 * | 6/2016 | Yanase | ................ | H01L 21/3043 |
| 2011/0290863 A1 | 12/2011 | Kajiwara et al. | | |

FOREIGN PATENT DOCUMENTS

JP 2011249257 12/2011

* cited by examiner

*Primary Examiner* — Vu A Vu
(74) *Attorney, Agent, or Firm* — Hamre, Schumann, Mueller & Larson, P.C.

(57) ABSTRACT

A semiconductor device includes a chip that includes a mounting surface, a non-mounting surface, and a side wall connecting the mounting surface and the non-mounting surface and has an eaves portion protruding further outward than the mounting surface at the side wall and a metal layer that covers the mounting surface.

20 Claims, 33 Drawing Sheets

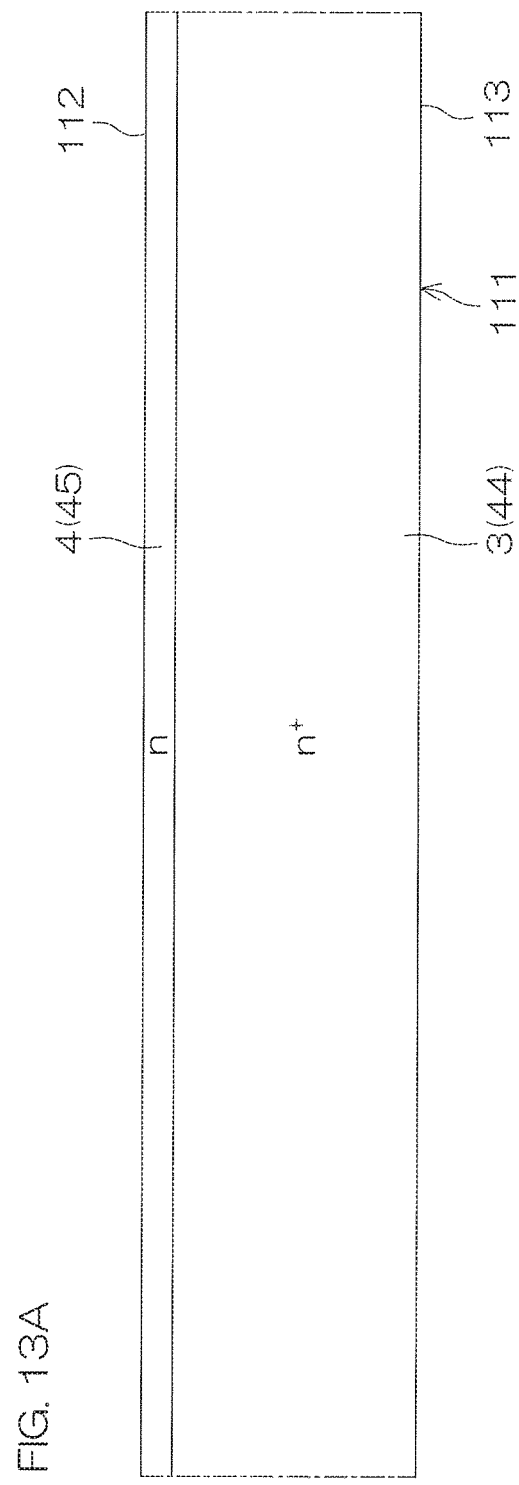

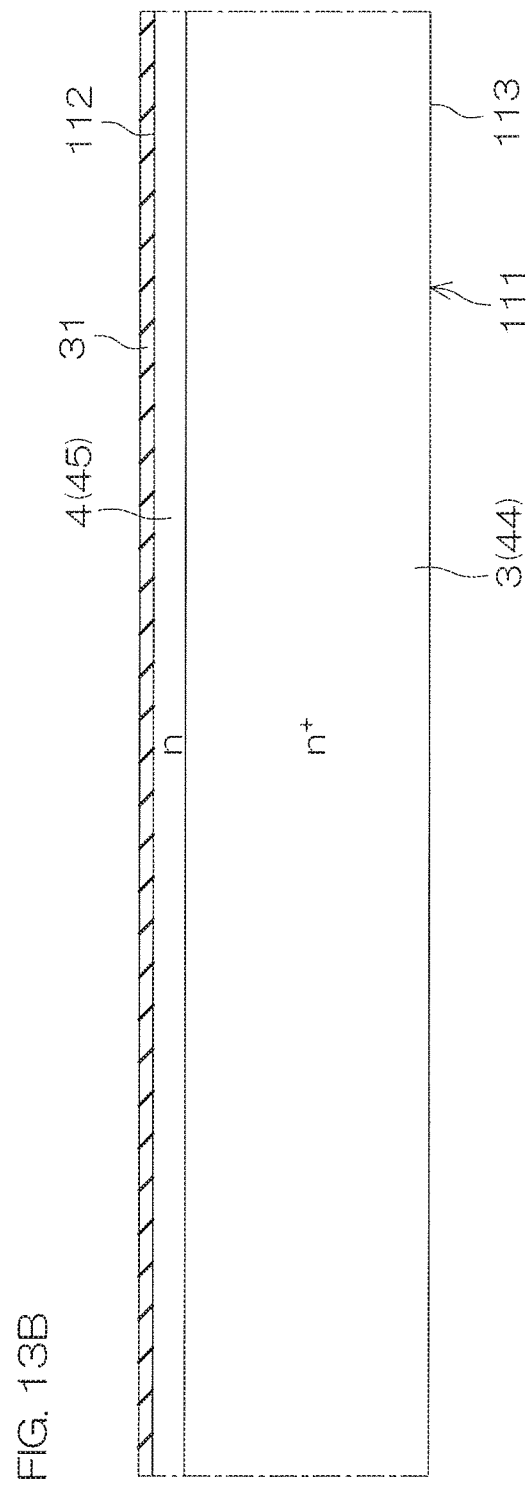

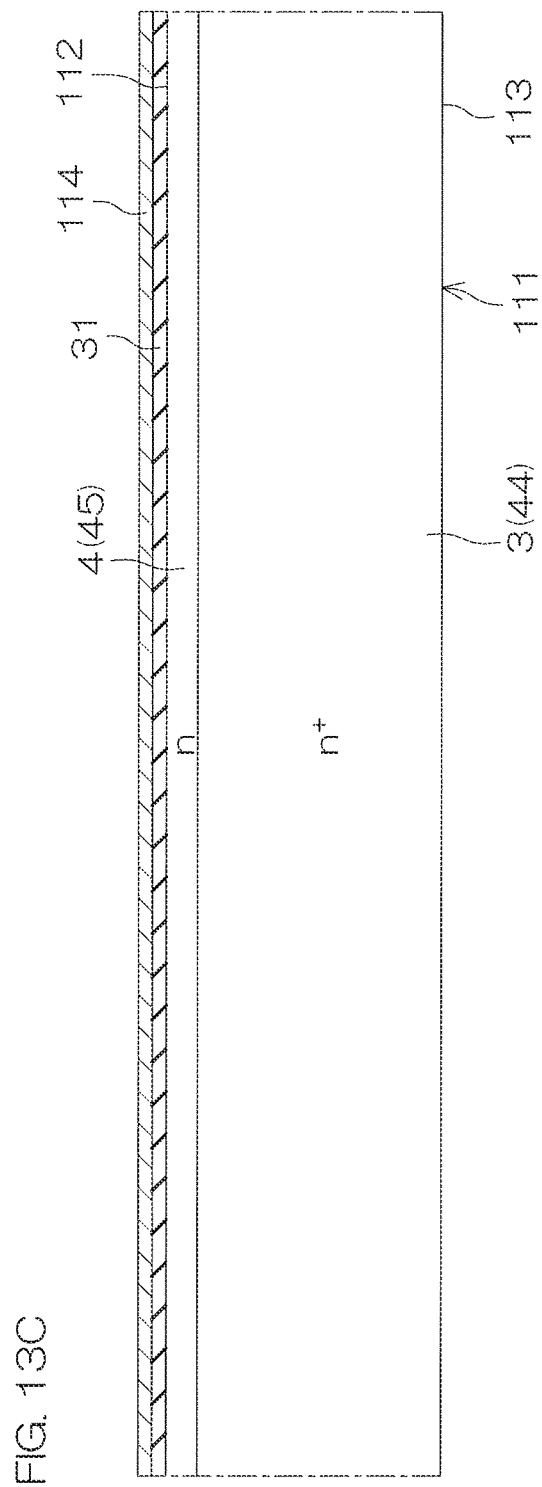

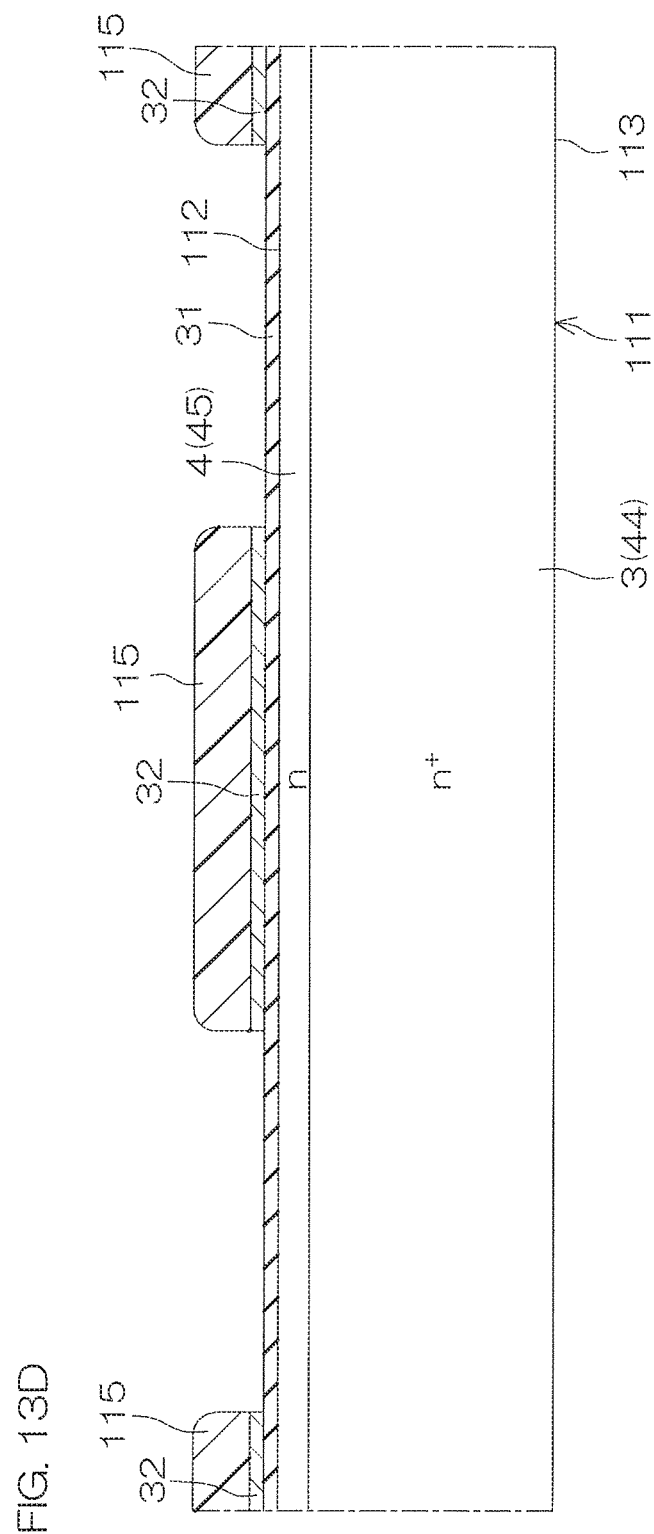

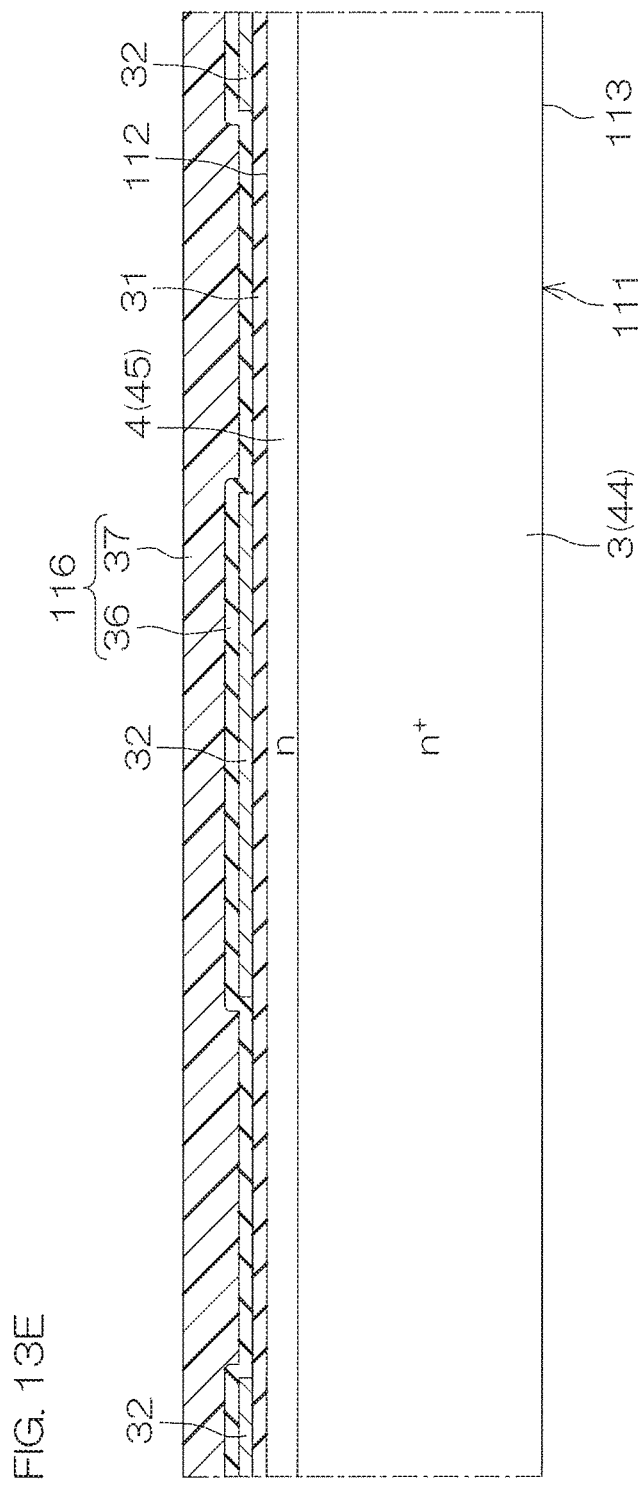

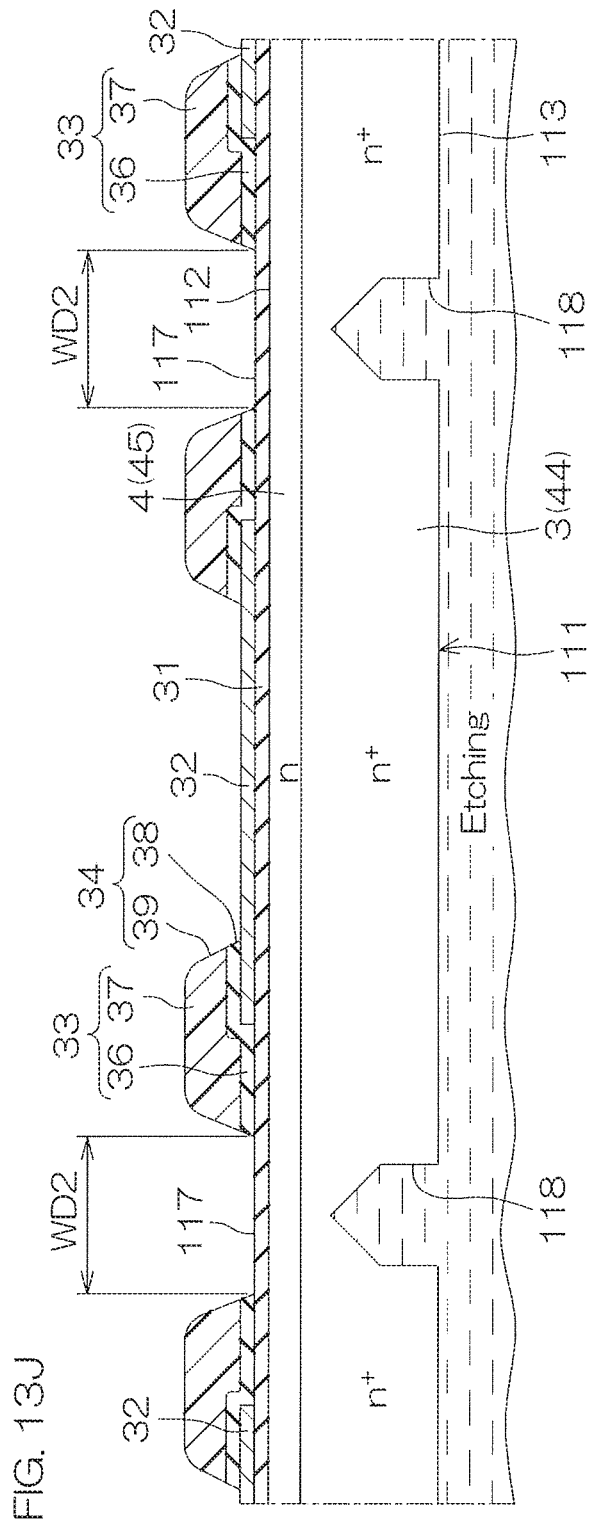

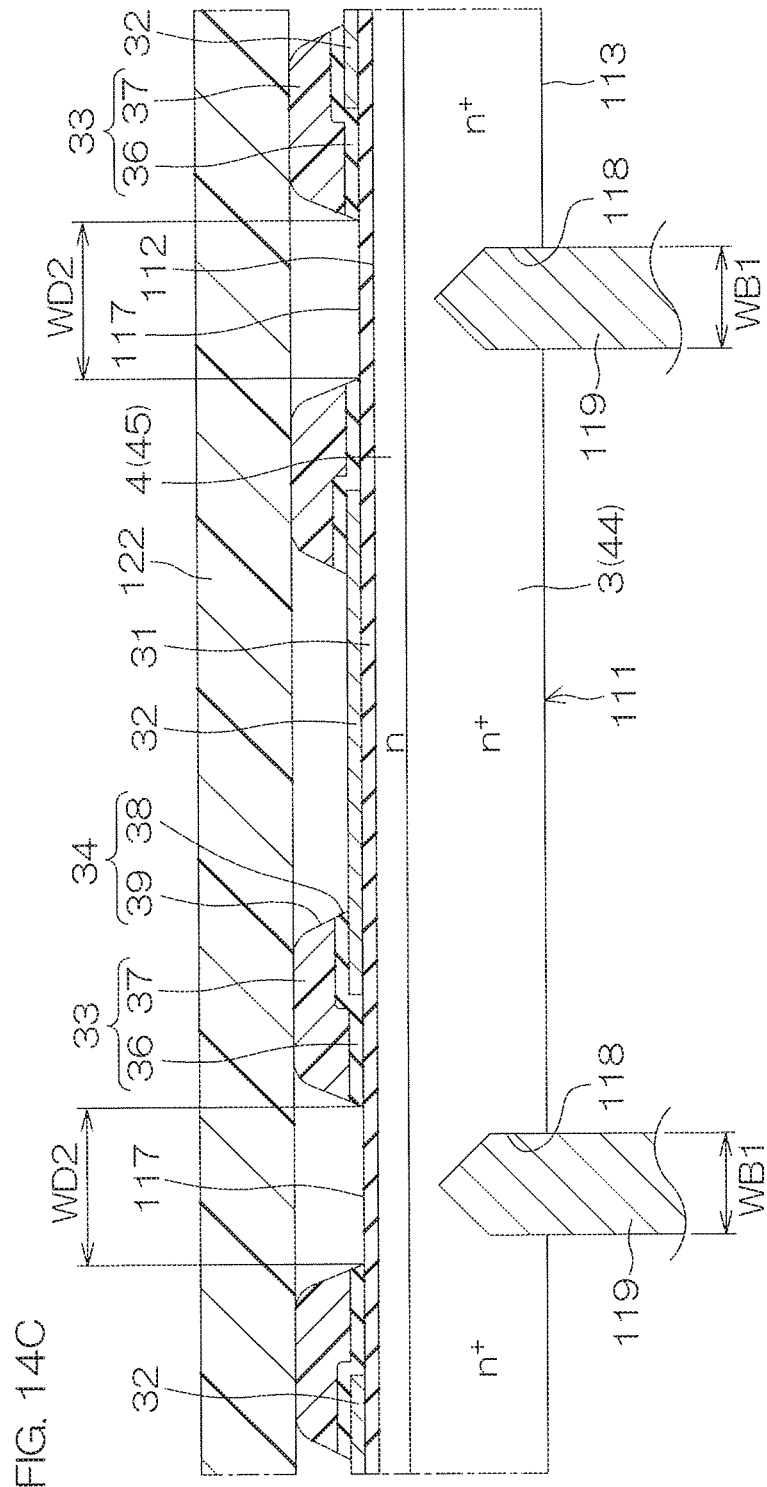

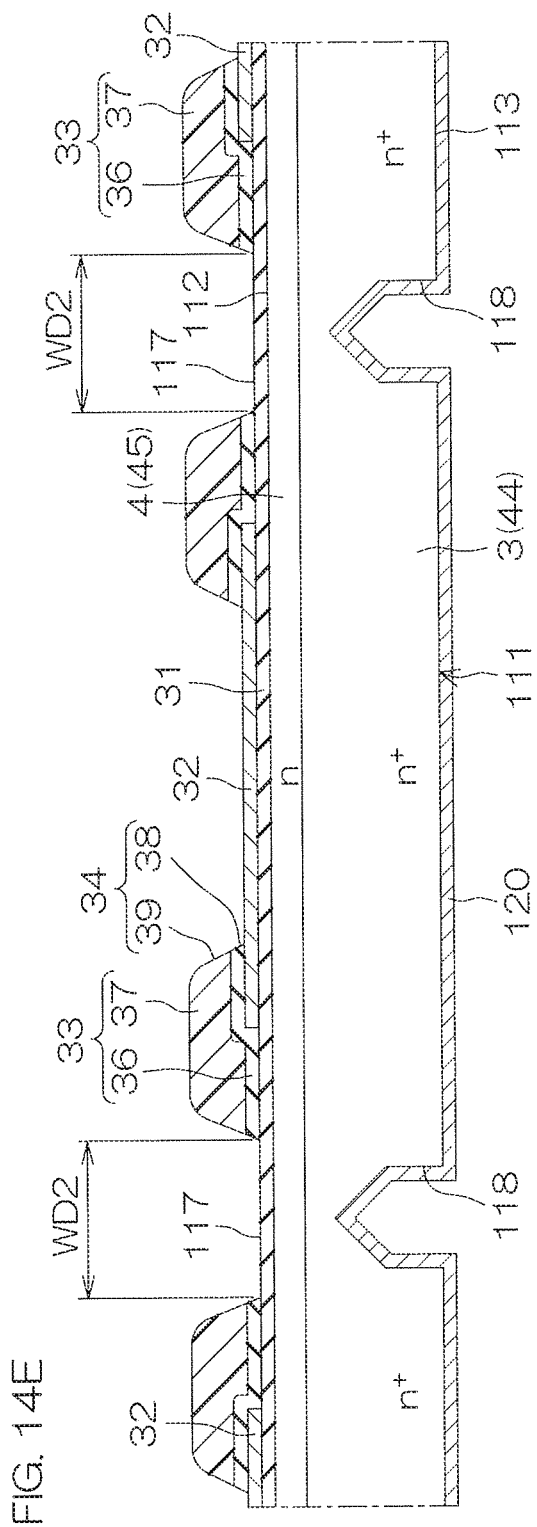

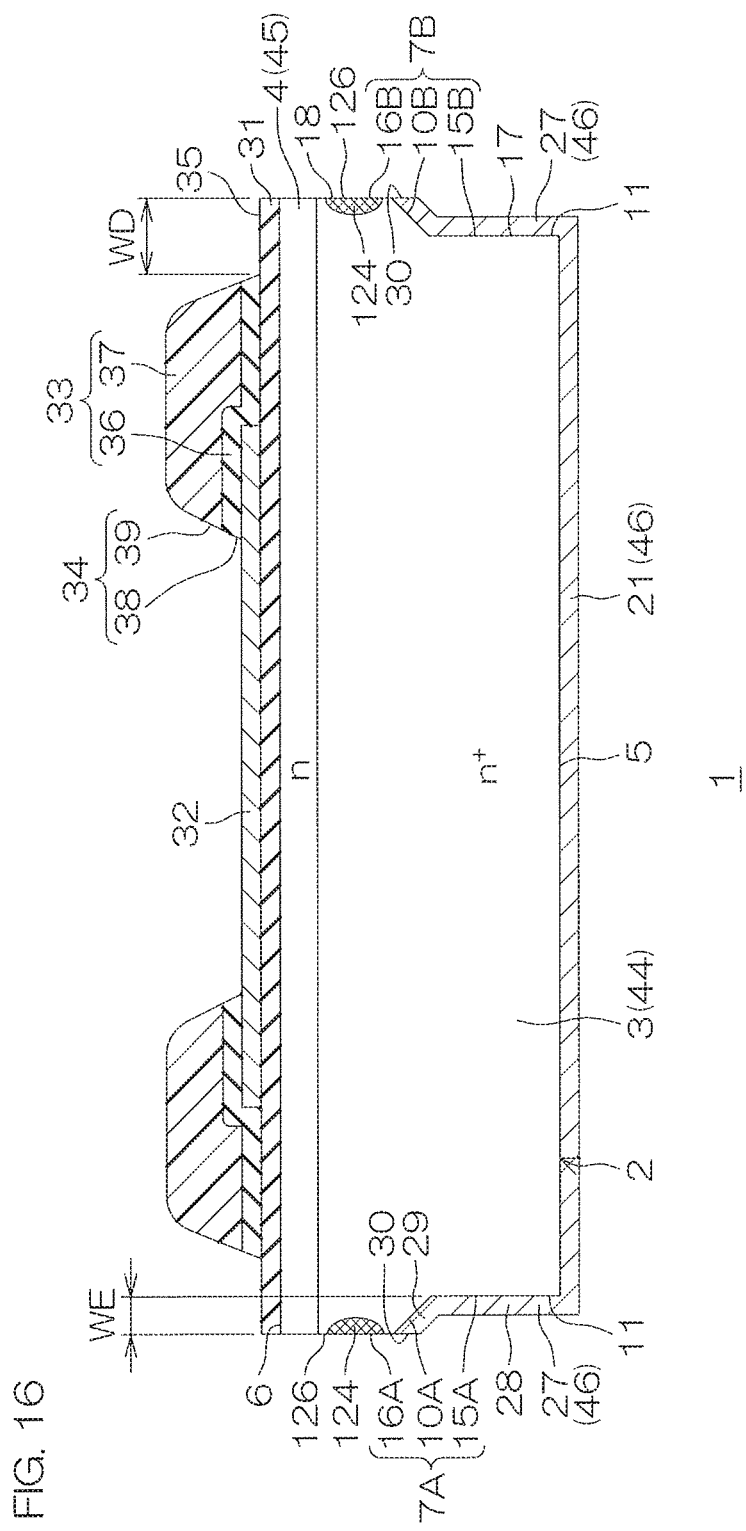

SEMICONDUCTOR DEVICE

CROSS REFERENCE TO RELATED APPLICATIONS

This application claims the benefit of priority to Japanese Patent Application No. 2019-097152 filed on May 23, 2019, and Japanese Patent Application No. 2020-072411 filed on Apr. 14, 2020. The entire contents of these applications are hereby incorporated herein by reference.

BACKGROUND OF THE INVENTION

1. Field of the Invention

The present invention relates to a semiconductor device.

2. Description of the Related Art

FIG. 9 of JP2011-249257A discloses a semiconductor package that includes a semiconductor device, a package main body, a die pad, a lead terminal, and a conductive bonding material. The semiconductor device includes a chip and a rear surface electrode that covers a rear surface of the chip. The semiconductor device is arranged on the die pad in an orientation where the rear surface electrode faces the die pad. The conductive bonding material is interposed between the die pad and the rear surface electrode and bonds the semiconductor device and the die pad.

SUMMARY OF THE INVENTION

A preferred embodiment of the present invention provides a semiconductor device including a chip that includes a mounting surface, a non-mounting surface, and a side wall connecting the mounting surface and the non-mounting surface and has an eaves portion protruding further outward than the mounting surface at the side wall and a metal layer that covers the mounting surface.

A preferred embodiment of the present invention provides a semiconductor device including a chip that has a laminated structure including a semiconductor substrate and an epitaxial layer, has a mounting surface at the semiconductor substrate side, a non-mounting surface at the epitaxial layer side, and a side wall formed by the semiconductor substrate and the epitaxial layer, and has an eaves portion protruding further outward than the mounting surface at a portion of the side wall constituted of the semiconductor substrate and a metal layer that covers the mounting surface.

The aforementioned or other objects, features, and effects of the present invention will be clarified by the following description of preferred embodiments given below with reference to the accompanying drawings.

BRIEF DESCRIPTION OF THE DRAWINGS

FIG. 14A to FIG. 14G are sectional views of steps after FIG. 13G and are sectional views for describing the method for manufacturing the semiconductor device shown in FIG. 1 in more detail.

FIG. 16 corresponds to FIG. 4 and is a sectional view of the semiconductor device manufactured through the steps of FIG. 15A and FIG. 15B.

DETAILED DESCRIPTION OF THE PREFERRED EMBODIMENTS

A preferred embodiment of the present invention provides a semiconductor device capable of suppressing flowing around of a conductive bonding material from a mounting surface to a non-mounting surface.

A preferred embodiment of the present invention provides a semiconductor device including a chip that includes a mounting surface, a non-mounting surface, and a side wall connecting the mounting surface and the non-mounting surface and has an eaves portion protruding further outward than the mounting surface at the side wall and a metal layer that covers the mounting surface. According to the present semiconductor device, flowing around of a conductive bonding material from the mounting surface to the non-mounting surface can be suppressed by the eaves portion.

A preferred embodiment of the present invention provides a semiconductor device including a chip that has a laminated structure including a semiconductor substrate and an epitaxial layer, has a mounting surface at the semiconductor substrate side, a non-mounting surface at the epitaxial layer side, and a side wall formed by the semiconductor substrate and the epitaxial layer, and has an eaves portion protruding further outward than the mounting surface at a portion of the side wall constituted of the semiconductor substrate and a metal layer that covers the mounting surface. According to the present semiconductor device, flowing around of a conductive bonding material from the mounting surface to the non-mounting surface can be suppressed by the eaves portion.

Hereinafter, preferred embodiments of the present invention will be described in detail with reference to the attached drawings.

Figure 1:
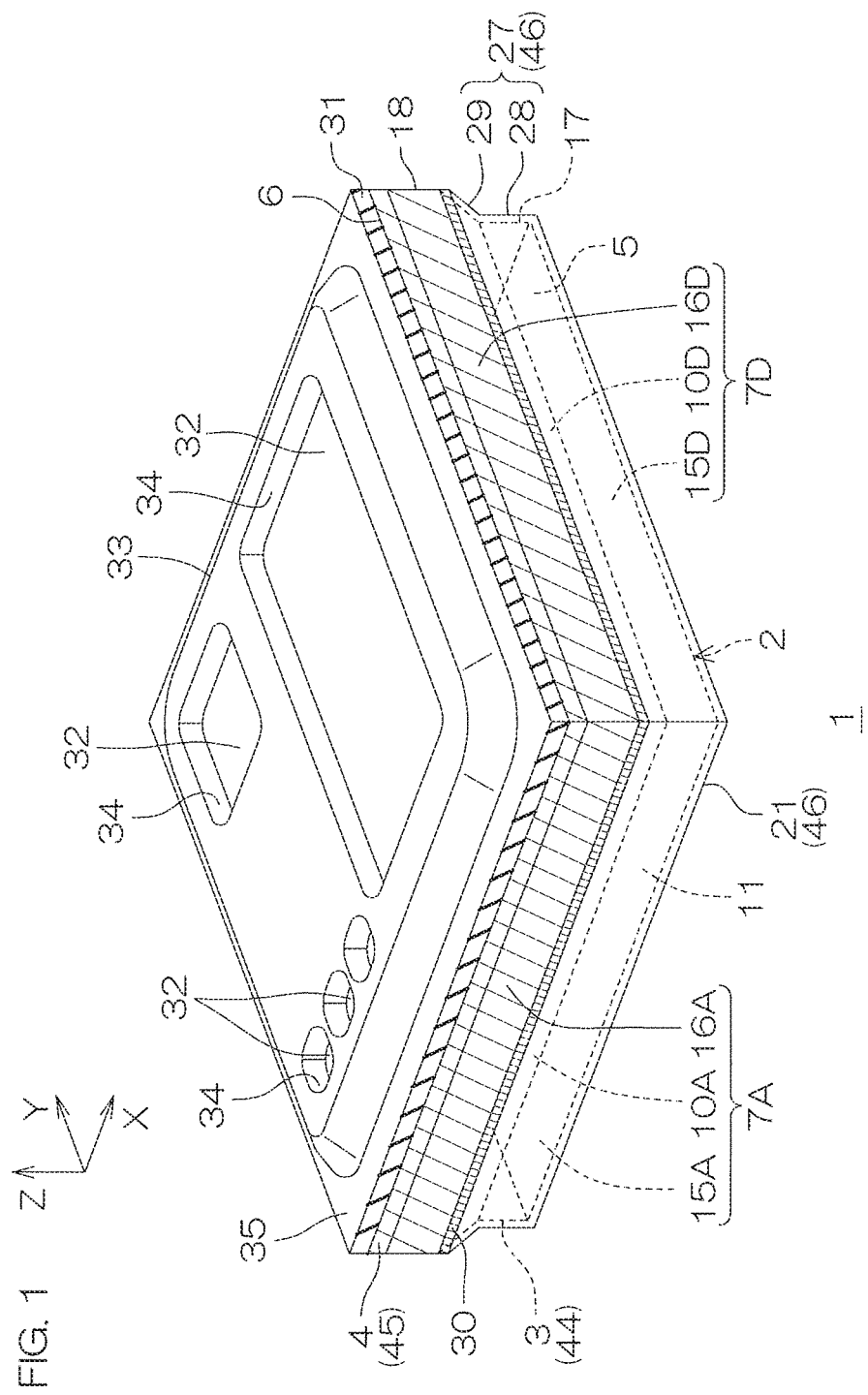
FIG. 1 is a perspective view of a semiconductor device according to a preferred embodiment of the present invention.
Figure 2:
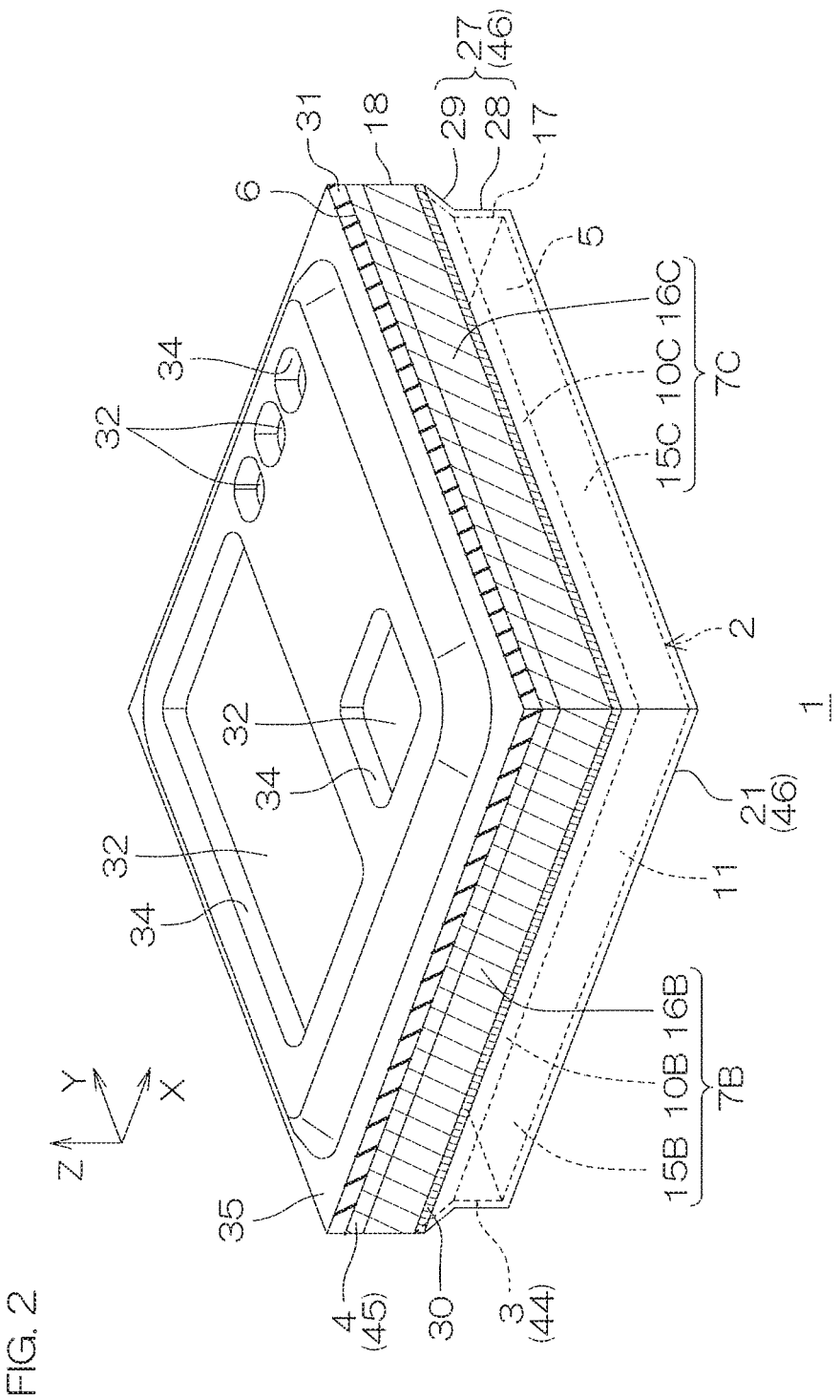
FIG. 2 is a perspective view in which the semiconductor device shown in FIG. 1 is viewed from another direction.
Figure 3:
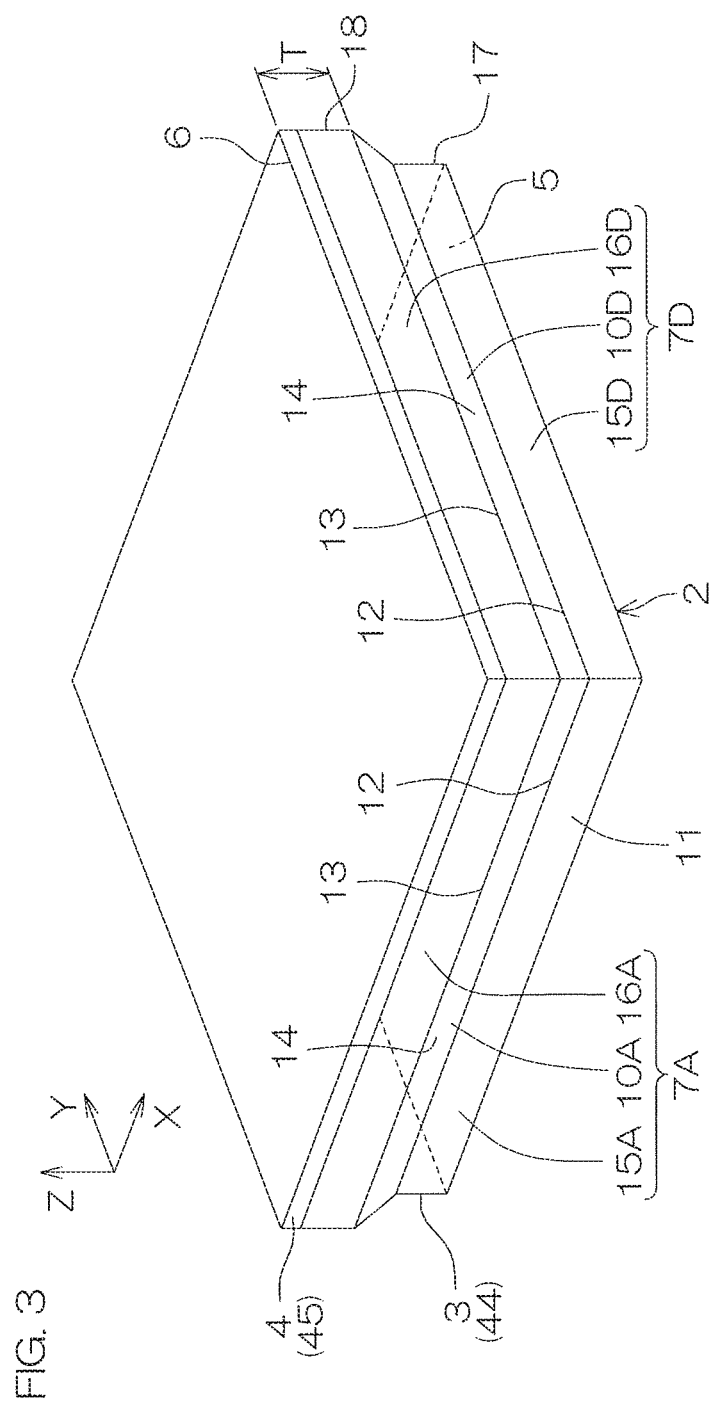
FIG. 3 is a perspective view of a chip shown in FIG. 1.
Figure 4:
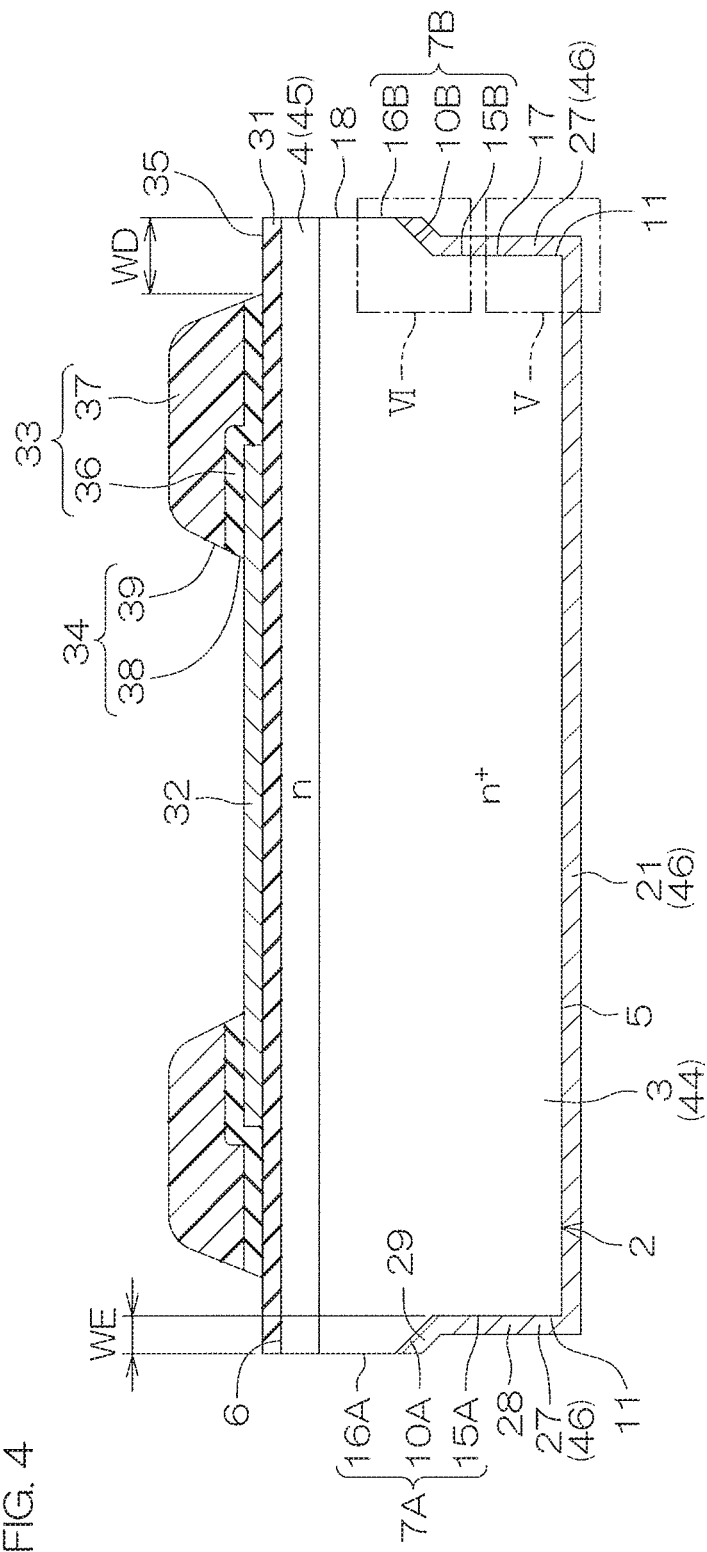
FIG. 4 is a sectional view of the semiconductor device shown in FIG. 1.
Figure 5:
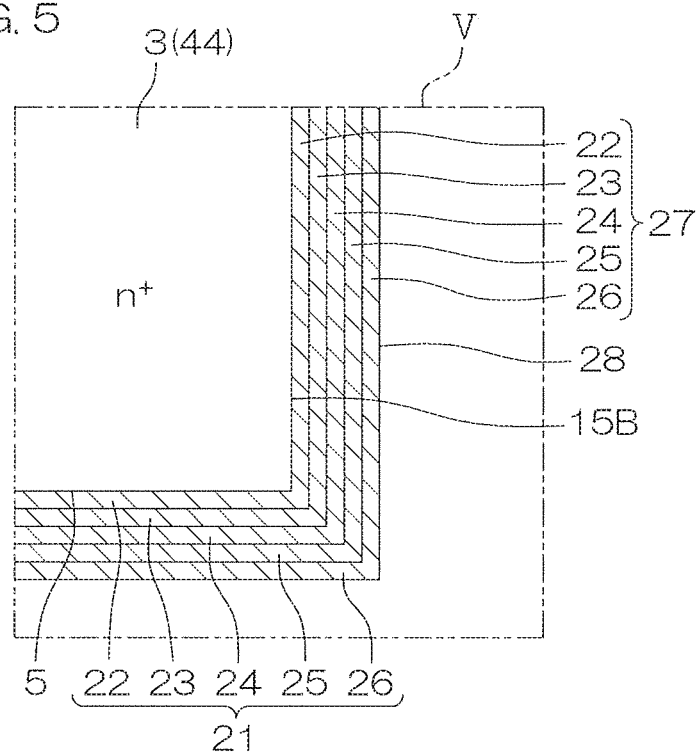
FIG. 5 is an enlarged view of a region V shown in FIG. 4.
Figure 6:
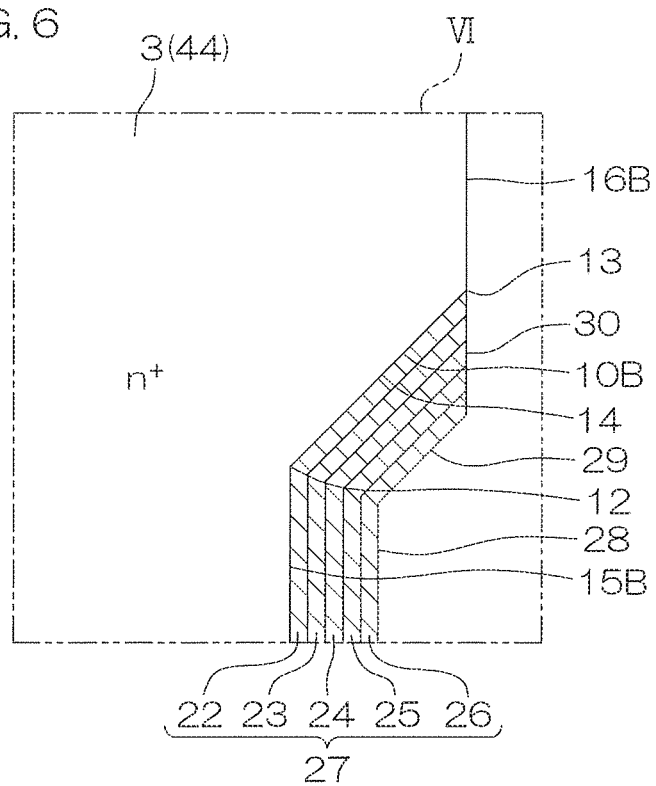
FIG. 6 is an enlarged view of a region VI shown in FIG. 4.

FIG. 1 is a perspective view of a semiconductor device 1 according to a preferred embodiment of the present invention. FIG. 2 is a perspective view in which the semiconductor device 1 shown in FIG. 1 is viewed from another direction. FIG. 3 is a perspective view of a chip 2 shown in FIG. 1. FIG. 4 is a sectional view of the semiconductor device 1 shown in FIG. 1. FIG. 5 is an enlarged view of a region V shown in FIG. 4. FIG. 6 is an enlarged view of a region VI shown in FIG. 4.

Referring to FIG. 1 to FIG. 6, the semiconductor device 1 includes a chip 2 made of silicon. In FIG. 1 to FIG. 6, in order to make clear the structure of the chip 2, the chip 2 is shown in dimensions differing from actual dimensions (the same applies to other drawings hereinafter). In this embodiment, the chip 2 has a laminated structure that includes a substrate 3 and an epitaxial layer 4. A conductivity type of the substrate 3 and a conductivity type of the epitaxial layer 4 are n-type in this embodiment.

An n-type impurity concentration of the substrate 3 may be not less than $1 \times 10^{18}$ cm$^{-3}$ and not more than $1 \times 10^{21}$ cm$^{-3}$. The epitaxial layer 4 has an n-type impurity concentration less than the n-type impurity concentration of the substrate 3. The n-type impurity concentration of the epitaxial layer 4 may be not less than $1 \times 10^{15}$ cm$^{-3}$ and not more than $1 \times 10^{18}$ cm$^{-3}$.

A thickness of the substrate 3 may be not less than 50 μm and not more than 450 μm. The thickness of the substrate 3 may be not less than 50 μm and not more than 150 μm, not less than 150 μm and not more than 250 μm, not less than 250 μm and not more than 350 μm, or not less than 350 μm and not more than 450 μm. By making the substrate 3 thin, a resistance value of the chip 2 can be reduced. The thickness of the substrate 3 is adjusted by grinding.

The epitaxial layer 4 has a thickness less than the substrate 3. The thickness of the epitaxial layer 4 may be not less than 5 μm and not more than 50 μm. The thickness of the epitaxial layer 4 may be not less than 5 μm and not more than 10 μm, not less than 10 μm and not more than 20 μm, not less than 20 μm and not more than 30 μm, not less than 30 μm and not more than 40 μm, or not less than 40 μm and not more than 50 μm. The thickness of the epitaxial layer 4 is preferably not less than 10 μm and not more than 30 μm.

The chip 2 has a mounting surface 5 at one side, a non-mounting surface 6 at the other side, and four side walls 7A to 7D connecting the mounting surface 5 and the non-mounting surface 6. The mounting surface 5 is a facing surface that faces a connection object when the semiconductor device 1 is to be connected to the connection object.

The mounting surface 5 is formed by the substrate 3. The non-mounting surface 6 is formed by the epitaxial layer 4. The side walls 7A to 7D are each formed by the substrate 3 and the epitaxial layer 4.

The mounting surface 5 is formed in a quadrilateral shape in a plan view as viewed from a normal direction Z of the mounting surface 5 (hereinafter referred to simply as "plan view"). In this embodiment, the mounting surface 5 is formed in a square shape. The mounting surface 5 may be formed in a rectangular shape. The mounting surface 5 has a first area S1.

The non-mounting surface 6 is formed in a quadrilateral shape in plan view. In this embodiment, the non-mounting surface 6 is formed in a square shape. The non-mounting surface 6 may be formed in a rectangular shape. The non-mounting surface 6 has a second area S2 that exceeds the first area S1 of the mounting surface 5 (S1<S2). The non-mounting surface 6 preferably has a planar shape that is similar to the planar shape of the mounting surface 5.

The non-mounting surface 6 protrudes further outward than the mounting surface 5 along planar directions (tangential directions) of the mounting surface 5. In this embodiment, the non-mounting surface 6 protrudes further outward than the mounting surface 5 across an entire periphery. The non-mounting surface 6 is a device surface at which a functional device is formed.

The side walls 7A to 7D specifically include the first side wall 7A, the second side wall 7B, the third side wall 7C, and the fourth side wall 7D. The first side wall 7A and the second side wall 7B extend along a first direction X and face each other in a second direction Y intersecting the first direction X. The third side wall 7C and the fourth side wall 7D extend along the second direction Y and face each other in the first direction X. Specifically, the second direction Y is orthogonal to the first direction X. A length of the side walls 7A to 7D may be not less than 0.5 mm and not more than 2 mm, respectively.

The side walls 7A to 7D respectively have, in regions between the mounting surface 5 and the non-mounting surface 6, eaves portions 10A to 10D that protrude further outward than the mounting surface 5 along the planar directions (tangential directions) of the mounting surface 5. The eaves portions 10A to 10D face the non-mounting surface 6 in the normal direction Z. The eaves portions 10A to 10D are formed by notched portions 11 at which peripheral edge portions of the mounting surface 5 are notched toward the non-mounting surface 6. Specifically, the eaves portions 10A to 10D include a first eaves portion 10A, a second eaves portion 10B, a third eaves portion 10C, and a fourth eaves portion 10D.

The first eaves portion 10A is formed in the first side wall 7A. The first eaves portion 10A is formed as a band that extends along the first direction X in the first side wall 7A. The first eaves portion 10A extends in a direction parallel to the mounting surface 5 (non-mounting surface 6). The first eaves portion 10A extends, in the first side wall 7A, from a corner portion at the third side wall 7C side to a corner portion at the fourth side wall 7D side.

The second eaves portion 10B is formed in the second side wall 7B. The second eaves portion 10B is formed as a band that extends along the first direction X in the second side wall 7B. The second eaves portion 10B extends in a direction parallel to the mounting surface 5 (non-mounting surface 6). The second eaves portion 10B extends, in the second side wall 7B, from a corner portion at the third side wall 7C side to a corner portion at the fourth side wall 7D side.

The third eaves portion 10C is formed in the third side wall 7C. The third eaves portion 10C is formed as a band that extends along the second direction Y in the third side wall 7C. The third eaves portion 10C extends in a direction parallel to the mounting surface 5 (non-mounting surface 6). The third eaves portion 10C extends, in the third side wall 7C, from a corner portion at the first side wall 7A side to a corner portion at the second side wall 7B side. The third eaves portion 10C is continuous to the first eaves portion 10A at the corner portion at the first side wall 7A side. The third eaves portion 10C is continuous to the second eaves portion 10B at the corner portion at the second side wall 7B side.

The fourth eaves portion 10D is formed in the fourth side wall 7D. The fourth eaves portion 10D is formed as a band that extends along the second direction Y in the fourth side wall 7D. The fourth eaves portion 10D extends in a direction parallel to the mounting surface 5 (non-mounting surface 6). The fourth eaves portion 10D extends, in the fourth side wall 7D, from a corner portion at the first side wall 7A side to a corner portion at the second side wall 7B side. The fourth eaves portion 10D is continuous to the first eaves portion 10A at the corner portion at the first side wall 7A side. The fourth eaves portion 10D is continuous to the second eaves portion 10B at the corner portion at the second side wall 7B side.

The eaves portions 10A to 10D are thus formed across an entire periphery of the chip 2. Also, the eaves portions 10A to 10D form a single eaves portion extending in an annular shape (in a quadrilateral annular shape in this embodiment) in plan view. The eaves portions 10A to 10D are respectively formed at intervals to the mounting surface 5 side from the non-mounting surface 6. The eaves portions 10A to 10D are respectively formed at intervals to the non-mounting surface 6 side from the mounting surface 5.

Preferably, the eaves portions 10A to 10D are respectively formed on the substrate 3. More preferably, the eaves portions 10A to 10D are respectively formed on the substrate 3 at intervals from the epitaxial layer 4. Variations in physical properties and electrical properties of the epitaxial layer 4 due to the eaves portions 10A to 10D can thereby be suppressed and therefore, variations in electrical characteristics of the functional device formed in the epitaxial layer 4 can be suppressed appropriately. The eaves portions 10A to 10D do not necessarily have to be formed at the same depth position. At least one of the eaves portions 10A to 10D may be formed shifted in the normal direction Z from the other of the eaves portions 10A to 10D.

Referring to FIG. 3 and FIG. 4, each of the eaves portions 10A to 10D has an inner end portion 12 at the mounting surface 5 side, an outer end portion 13 at the non-mounting surface 6 side, and a connecting portion 14 connecting the inner end portion 12 and the outer end portion 13 in plan view. In this embodiment, the outer end portion 13 is positioned at the non-mounting surface 6 side with respect to the inner end portion 12 in regard to the normal direction Z. Thereby, the connecting portion 14 has an inclined surface inclined from the inner end portion 12 toward the outer end portion 13. The connecting portion 14 may extend flatly between the inner end portion 12 and the outer end portion 13. The connecting portion 14 may be formed in a curved shape recessed toward the non-mounting surface 6 side between the inner end portion 12 and the outer end portion 13.

The outer end portion 13 may be positioned on the same plane as the inner end portion 12. The connecting portion 14 may extend in a direction parallel to the mounting surface 5 and the non-mounting surface 6.

The side walls 7A to 7D respectively have first connecting walls 15A to 15D connecting the mounting surface 5 and the inner end portions 12 of the eaves portions 10A to 10D and second connecting walls 16A to 16D connecting the non-mounting surface 6 and the outer end portions 13 of the eaves portions 10A to 10D. The notched portions 11 mentioned above are formed by the eaves portions 10A to 10D and the first connecting walls 15A to 15D and are recessed from the mounting surface 5 toward the non-mounting surface 6.

The first connecting walls 15A to 15D are formed by the substrate 3. The first connecting walls 15A to 15D are formed at an angle differing from the eaves portions 10A to 10D. The first connecting walls 15A to 15D may extend along a direction perpendicular to the mounting surface 5 in regions between peripheral edges of the mounting surface 5 and the inner end portions 12 of the eaves portions 10A to 10D.

If the inner end portions 12 of the eaves portions 10A to 10D are positioned further outward than the peripheral edges of the mounting surface 5, the first connecting walls 15A to 15D may be upwardly inclined from the peripheral edges of the mounting surface 5 toward the inner end portions 12 of the eaves portions 10A to 10D. If the inner end portions 12 of the eaves portions 10A to 10D are positioned further inward than the peripheral edges of the mounting surface 5, the first connecting walls 15A to 15D may be downwardly inclined from the inner end portions 12 of the eaves portions 10A to 10D toward the peripheral edges of the mounting surface 5.

The second connecting walls 16A to 16D are formed by the substrate 3 and the epitaxial layer 4. The second connecting walls 16A to 16D are formed at an angle differing from the eaves portions 10A to 10D. The second connecting walls 16A to 16D may extend along a direction perpendicular to the non-mounting surface 6 in regions between peripheral edges of the non-mounting surface 6 and the outer end portions 13 of the eaves portions 10A to 10D. The second connecting walls 16A to 16D may be constituted of ground surfaces (cut surfaces) having grinding marks.

If the outer end portions 13 of the eaves portions 10A to 10D are positioned further outward than the peripheral edges of the non-mounting surface 6, the second connecting walls 16A to 16D may be downwardly inclined from the peripheral edges of the non-mounting surface 6 toward the outer end portions 13 of the eaves portions 10A to 10D. If the outer end portions 13 of the eaves portions 10A to 10D are positioned further inward than the peripheral edges of the non-mounting surface 6, the second connecting walls 16A to 16D may be upwardly inclined from the outer end portions 13 of the eaves portions 10A to 10D toward the peripheral edges of the non-mounting surface 6.

A thickness T of the second connecting walls 16A to 16D may, under a condition of exceeding the thickness of the epitaxial layer 4, be not less than 10 μm and not more than 200 μm. The thickness T may be not less than 10 μm and not more than 50 μm, not less than 50 μm and not more than 100 μm, not less than 100 μm and not more than 150 μm, or not less than 150 μm and not more than 200 μm.

A width WE of the eaves portions 10A to 10D may be not less than 10 μm and not more than 100 μm. The width WE is a width in a direction orthogonal to the direction in which the eaves portions 10A to 10D extend in plan view. The width WE may be not less than 10 μm and not more than 20 μm, not less than 20 μm and not more than 40 μm, not less than 40 μm and not more than 60 μm, not less than 60 μm and not more than 80 μm, or not less than 80 μm and not more than 100 μm. The width WE is preferably not less than 20 μm and not more than 60 μm.

The chip 2 thus has a hammerhead structure having a body portion 17 and a head portion 18. In FIG. 1 and FIG. 2, the head portion 18 is indicated by hatching. The body portion 17 includes the mounting surface 5 and the first connecting walls 15A to 15D. The head portion 18 includes the non-mounting surface 6, the eaves portions 10A to 10D, and the second connecting walls 16A to 16D.

The eaves portions 10A to 10D suppress a conductive bonding material 104 (see FIG. 11 and FIG. 12 to be described below) constituted of solder or metal paste from flowing around from the mounting surface 5 side to the non-mounting surface 6 side when the semiconductor device 1 is bonded to a connection object.

The semiconductor device 1 includes a first metal layer 21 that covers the mounting surface 5. The first metal layer 21 covers an entirety of the mounting surface 5. The first metal layer 21 is formed as a bonded layer bonded to the connection object via the conductive bonding material 104.

The first metal layer 21 may have a laminated structure in which a plurality of metal layers are laminated or may have a single layer structure constituted of a single metal layer. The first metal layer 21 preferably has an outer surface formed by a metal with an affinity (wetting property) with respect to the conductive bonding material 104 being higher than that of the chip 2 (silicon). The first metal layer 21 preferably has an outer surface that includes a noble metal.

In this embodiment, the first metal layer 21 has a laminated structure that includes a Ti layer 22, an Ni layer 23, an Au layer 24, a Pd layer 25, and an Ag layer 26 that are laminated in that order from the mounting surface 5 side. The Ti layer 22 is formed as an ohmic electrode with respect to the chip 2 (substrate 3).

The first metal layer 21 is not required to include all of the Ti layer 22, the Ni layer 23, the Au layer 24, the Pd layer 25, and the Ag layer 26. The first metal layer 21 may have a laminated structure that includes the Ti layer 22, the Ni layer 23, the Au layer 24, and the Ag layer 26. The first metal layer 21 may have a laminated structure that includes the Ti layer 22, the Ni layer 23, and the Au layer 24. The first metal layer 21 may have a single layer structure constituted of the Ti layer 22 or the Au layer 24.

The semiconductor device 1 includes a second metal layer 27 (side wall metal layer) that covers the side walls 7A to 7D at intervals from the mounting surface 5 side from the non-mounting surface 6. Specifically, on the side walls 7A to 7D, the second metal layer 27 covers a region between the mounting surface 5 and the second connecting walls 16A to 16D such as to expose the second connecting walls 16A to 16D. That is, the second metal layer 27 exposes the epitaxial layer 4. Variations in the electrical properties of the epitaxial layer 4 due to the second metal layer 27 can thereby be suppressed and therefore, variations in the electrical characteristics of the functional device formed in the epitaxial layer 4 can be suppressed.

The second metal layer 27 is formed as a film along the first connecting walls 15A to 15D and the eaves portions 10A to 10D. The second metal layer 27 forms eaves portions corresponding to the eaves portions 10A to 10D on the side walls 7A to 7D of the chip 2.

Specifically, the second metal layer 27 includes a first covering portion 28 covering the first connecting walls 15A to 15D and a second covering portion 29 covering the eaves portions 10A to 10D. The first connecting walls 15A to 15D are continuous to the first metal layer 21 at the mounting surface 5 side.

The second covering portion 29 is continuous to the first covering portion 28 at the first connecting walls 15A to 15D sides. The second covering portion 29 includes an exposed portion 30 exposed from the second connecting walls 16A to 16D. In FIG. 1 and FIG. 2, the exposed portion 30 is indicated by hatching.

The exposed portion 30 is continuous to the second connecting walls 16A to 16D. Specifically, the exposed portion 30 is formed flush with the second connecting walls 16A to 16D. More specifically, the exposed portion 30 of the second covering portion 29 forms a single ground surface (cut surface) with the second connecting walls 16A to 16D.

The second metal layer 27 is formed as a heat sink by which heat generated at the chip 2 is absorbed from the side walls 7A to 7D sides and is formed at the same time as a bonded layer bonded to the connection object via the conductive bonding material 104. The second metal layer 27 may have a laminated structure in which a plurality of metal layers are laminated or may have a single layer structure constituted of a single metal layer.

The second metal layer 27 preferably has an outer surface formed by a metal with an affinity (wetting property) with respect to the conductive bonding material 104 being higher than that of the chip 2 (silicon). The second metal layer 27 preferably has an outer surface that includes a noble metal. In this embodiment, the second metal layer 27 has the same structure as the first metal layer 21 and is formed integral to the first metal layer 21. That is, the second metal layer 27 has the laminated structure that includes the Ti layer 22, the Ni layer 23, the Au layer 24, the Pd layer 25, and the Ag layer 26 that are laminated in that order from the side walls 7A to 7D sides.

The second metal layer 27 is not required to include all of the Ti layer 22, the Ni layer 23, the Au layer 24, the Pd layer 25, and the Ag layer 26. If the first metal layer 21 has the laminated structure that includes the Ti layer 22, the Ni layer 23, the Au layer 24, and the Ag layer 26, the second metal layer 27 preferably has the laminated structure that includes the Ti layer 22, the Ni layer 23, the Au layer 24, and the Ag layer 26.

If the first metal layer 21 has the laminated structure that includes the Ti layer 22, the Ni layer 23, and the Au layer 24, the second metal layer 27 preferably has the laminated structure that includes the Ti layer 22, the Ni layer 23, and the Au layer 24. If the first metal layer 21 has the single layer structure constituted of the Ti layer 22 or the Au layer 24, the second metal layer 27 preferably has the single layer structure constituted of the Ti layer 22 or the Au layer 24.

The mounting surface 5, the eaves portions 10A to 10D, and the first connecting walls 15A to 15D are preferably constituted of rough surfaces having a predetermined arithmetic mean roughness Ra. The mounting surface 5, the eaves portions 10A to 10D, and the first connecting walls 15A to 15D may be roughened by a roughening etching method.

The arithmetic mean roughness Ra may exceed 0 nm and be not more than 1000 nm. The arithmetic mean roughness Ra may exceed 0 nm and be not more than 200 nm or be not less than 200 nm and not more than 400 nm, not less than 400 nm and not more than 600 nm, not less than 600 nm and not more than 800 nm, or not less than 800 nm and not more than 1000 nm.

In this case, the first metal layer 21 covers the mounting surface 5 that is roughened. An adhesion force of the first metal layer 21 to the mounting surface 5 can thereby be increased and peeling of the first metal layer 21 from the mounting surface 5 can thus be suppressed appropriately. Also, the second metal layer 27 covers the eaves portions 10A to 10D and the first connecting walls 15A to 15D that are roughened. An adhesion force of the second metal layer 27 to the eaves portions 10A to 10D and the first connecting walls 15A to 15D can thereby be increased and peeling of the second metal layer 27 from the eaves portions 10A to 10D and the first connecting walls 15A to 15D can thus be suppressed appropriately.

On the other hand, the second connecting walls 16A to 16D preferably differ in appearance from the eaves portions 10A to 10D and the first connecting walls 15A to 15D. In this case, the second connecting walls 16A to 16D are preferably constituted of the ground surfaces (cut surfaces) having grinding marks.

The semiconductor device 1 includes an interlayer insulating layer 31 that covers the non-mounting surface 6. In FIG. 1 and FIG. 2, the interlayer insulating layer 31 is indicated by hatching. Peripheral edges of the interlayer insulating layer 31 are exposed from the second connecting walls 16A to 16D. In this embodiment, the peripheral edges of the interlayer insulating layer 31 are continuous to the second connecting walls 16A to 16D. Specifically, the peripheral edges of the interlayer insulating layer 31 are formed flush with the second connecting walls 16A to 16D. More specifically, the peripheral edges of the interlayer insulating layer 31 form a single ground surface (cut surface) with the second connecting walls 16A to 16D.

The interlayer insulating layer 31 covers substantially an entirety of the non-mounting surface 6. The interlayer insulating layer 31 may include at least one of an USG (undoped silica glass), PSG (phosphor silicate glass), and BPSG (boron phosphor silicate glass) as an example of silicon oxide. The interlayer insulating layer 31 has a single layer structure constituted of a USG layer. The interlayer insulating layer 31 may have a flattened principal surface. The principal surface of the interlayer insulating layer 31 may be constituted of a ground surface having grinding marks.

The semiconductor device 1 includes a plurality (five in this embodiment) of electrodes 32 formed on the non-mounting surface 6. The plurality of electrodes 32 are respectively formed on the interlayer insulating layer 31. The plurality of electrodes 32 are respectively formed as terminal electrodes that are externally connected by lead wires (for example, bonding wires), etc. The number, configuration, and planar shapes of the plurality of electrodes 32 are arbitrary and not restricted to those shown in FIG. 1, etc.

The plurality of electrodes 32 may each include at least one type of layer among a Ti layer, a TiN layer, an Al layer, a Cu layer, an AlSi layer, an AlCu layer, an AlSiCu layer, an Ni layer, an Au layer, a Pd layer, and an Ag layer.

The semiconductor device 1 includes a top insulating layer 33 that covers the interlayer insulating layer 31. The top insulating layer 33 has a plurality of pad openings 34 that expose the plurality of electrodes 32 respectively. Planar shapes of the plurality of pad openings 34 are arbitrary.

Peripheral edges of the top insulating layer 33 may be formed at intervals inwardly from the first connecting walls 15A to 15D in plan view. The peripheral edges of the top insulating layer 33 may be positioned in regions between the first connecting walls 15A to 15D and the second connecting walls 16A to 16D in plan view.

The peripheral edges of the top insulating layer 33 are formed at intervals inwardly from the second connecting walls 16A to 16D in plan view. The peripheral edges of the top insulating layer 33 demarcate a dicing street 35 with the second connecting walls 16A to 16D. The dicing street 35 is formed as a band extending along the second connecting walls 16A to 16D. Specifically, the dicing street 35 is formed in an annular shape (a quadrilateral annular shape in this embodiment) that surrounds the top insulating layer 33.

A width WD of the dicing street 35 may be not less than 1 μm and not more than 100 μm. The width WD is a width in a direction orthogonal to a direction in which the dicing street 35 extends. The width WD may be not less than 1 μm and not more than 25 μm, not less than 25 μm and not more than 50 μm, not less than 50 μm and not more than 75 μm, or not less than 75 μm and not more than 100 μm.

By the dicing street 35, it is made unnecessary to physically cut the top insulating layer 33 when cutting out the semiconductor device 1 from a wafer 111 (see FIG. 13A to FIG. 13L to be described below). The semiconductor device 1 can thereby be cut out smoothly from the wafer 111. Also, cracking of the chip 2 (in particular, the second connecting walls 16A to 16D) due to peeling off or degradation of the top insulating layer 33 can be suppressed. The chip 2 having the eaves portions 10A to 10D can thus be formed appropriately.

Referring to FIG. 4, in this embodiment, the top insulating layer 33 has a laminated structure that includes a passivation layer 36 and a resin layer 37 laminated in that order from the non-mounting surface 6 side.

The passivation layer 36 preferably includes an insulating material differing from that of the interlayer insulating layer 31. In this embodiment, the passivation layer 36 is constituted of a silicon nitride layer. The passivation layer 36 is formed as a film along the interlayer insulating layer 31 and the plurality of electrodes 32. The passivation layer 36 has a plurality of first openings 38 that expose portions of the plurality of electrodes 32 respectively. Planar shapes of the plurality of first openings 38 are arbitrary.

A thickness of the passivation layer 36 may be not less than 0.1 μm and not more than 20 μm. The thickness of the passivation layer 36 may be not less than 0.1 μm and not more than 1 μm, not less than 1 μm and not more than 5 μm, not less than 5 μm and not more than 10 μm, not less than 10 μm and not more than 15 μm, or not less than 15 μm and not more than 20 μm.

The resin layer 37 is formed as film along a principal surface of the passivation layer 36. The resin layer 37 may include a photosensitive resin. The photosensitive resin may be of a negative type or a positive type. The resin layer 37 may include at least one of a polyimide, a polyamide, and a polybenzoxazole. In this embodiment, the resin layer 37 includes polybenzoxazole.

In this embodiment, peripheral edges of the resin layer 37 expose peripheral edges of the passivation layer 36. The peripheral edges of the top insulating layer 33 are formed by the resin layer 37 and the passivation layer 36. The resin layer 37 may cover the peripheral edges of the passivation layer 36.

The resin layer 37 has a plurality of second openings 39 that expose portions of the plurality of electrodes 32 respectively. Planar shapes of the plurality of second openings 39 are arbitrary. Each second opening 39 is in communication with a corresponding first opening 38 and forms a single pad opening 34 with the corresponding first opening 38.

Inner walls of the respective second openings 39 may be formed flush with inner walls of the respective first openings 38. The inner walls of the respective second openings 39 may be positioned at outer sides of the respective first openings 38. That is, the resin layer 37 may expose the inner walls of the respective first openings 38. The inner walls of the respective second openings 39 may be positioned at inner sides of the respective first openings 38. That is, the resin layer 37 may cover the inner walls of the respective first openings 38.

A thickness of the resin layer 37 may be not less than 1 μm and not more than 50 μm. The thickness of the resin layer 37 may be not less than 1 μm and not more than 10 μm, not less than 10 μm and not more than 20 μm, not less than 20 μm and not more than 30 μm, not less than 30 μm and not more than 40 μm, or not less than 40 μm and not more than 50 μm.

Figure 7:
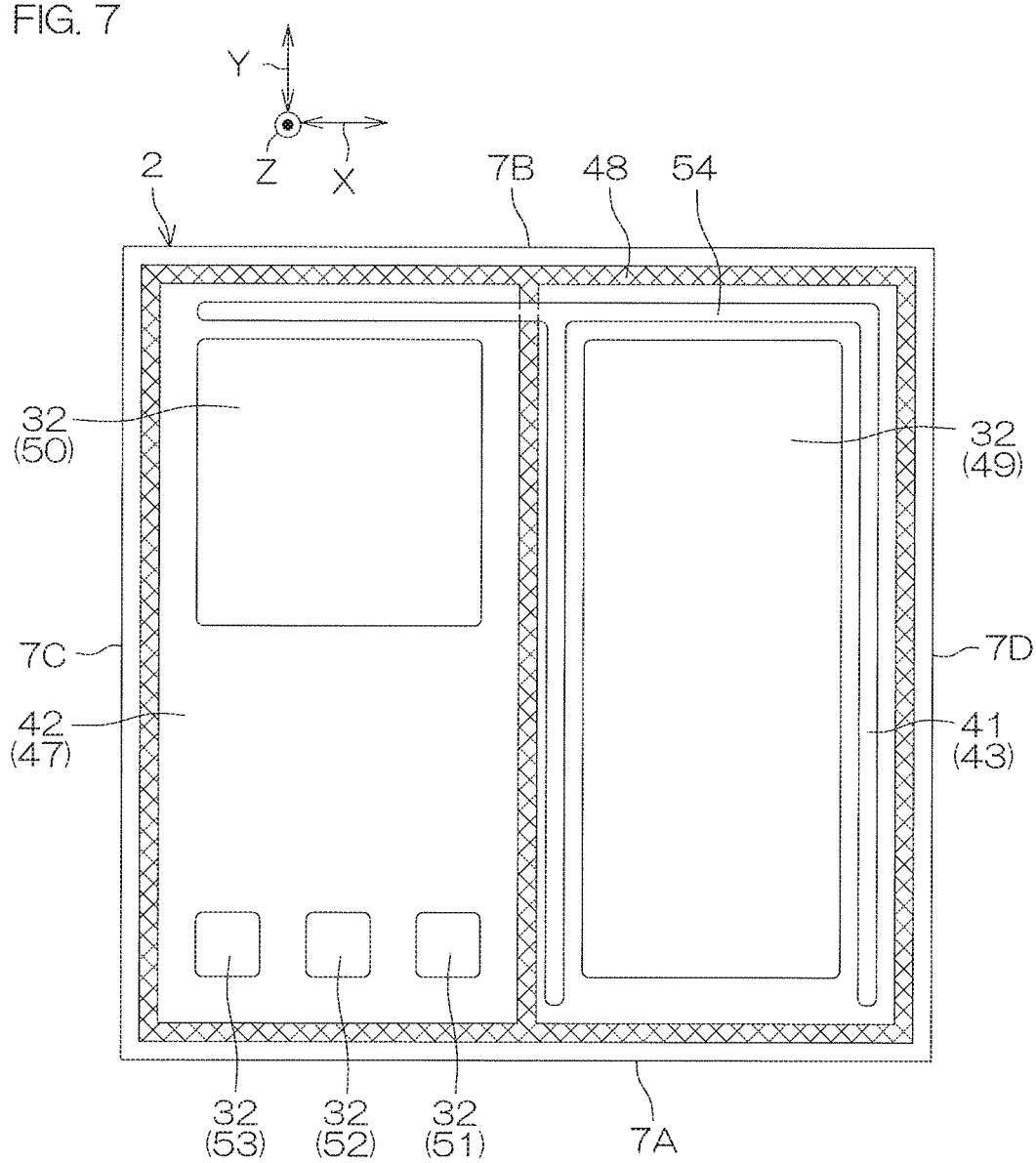
FIG. 7 is a plan view of a structure at a non-mounting surface side of the semiconductor device shown in FIG. 1.

FIG. 7 is a plan view of a structure at the non-mounting surface 6 side of the semiconductor device 1 shown in FIG. 1. FIG. 7 is a schematic view and illustration of the top insulating layer 33 is omitted.

Referring to FIG. 7, the non-mounting surface 6 includes an output region 41 and an input region 42. The output region 41 is formed in a region at the third side wall 7C side. The input region 42 is formed in a region at the fourth side wall 7D side. An area of the output region 41 is preferably not less than an area of the input region 42. A planar shape of the input region 42 and a planar shape of the output region 41 are arbitrary and not restricted to specific shapes.

The output region 41 includes a power MISFET (metal insulator semiconductor field effect transistor) 43 as an example of a functional device. The power MISFET 43 includes a gate, a drain, and a source.

That is, the substrate 3 is formed as a drain region 44 of the power MISFET 43. Also, the epitaxial layer 4 is formed as a drift region 45 of the power MISFET 43. Also, the first metal layer 21 and the second metal layer 27 are formed as a drain electrode 46 of the power MISFET 43.

The input region 42 includes a control circuit 47 as an example of a functional device. The control circuit 47 includes a plurality of types of functional circuits that realize various functions. The plurality of types of functional circuits include a circuit that generates a gate signal that drives and controls the power MISFET 43 based on an electrical signal from an exterior. The control circuit 47 forms a so-called IPD (intelligent power device) together with the power MISFET 43. The IPD is also referred to as an IPM (intelligent power module).

The semiconductor device 1 includes a region separating structure 48 that electrically separates the output region 41 and the input region 42. In FIG. 7, the region separating structure 48 is indicated by hatching. Although specific description shall be omitted, the region separating structure 48 may have a trench insulating structure with which an insulator is embedded in a trench. The region separating structure 48 may include a conductor embedded in the trench across the insulator. In this case, the conductor is preferably source-grounded.

The output region 41, the input region 42, and the region separating structure 48 are formed inside a region surrounded by the eaves portions 10A to 10D (first connecting walls 15A to 15D) in plan view. That is, the functional devices are formed inside the region surrounded by the eaves portions 10A to 10D (first connecting walls 15A to 15D) in plan view.

In this embodiment, the plurality of electrodes 32 include a source electrode 49, an input electrode 50, a reference voltage electrode 51, an ENABLE electrode 52, and a SENSE electrode 53. The source electrode 49 is formed on the output region 41. The input electrode 50, the reference voltage electrode 51, the ENABLE electrode 52, and the SENSE electrode 53 are respectively formed on the input region 42.

The source electrode 49 transmits a source voltage to the source of the power MISFET 43. The input electrode 50 transmits an input voltage for driving the control circuit 47. The reference voltage electrode 51 transmits a reference voltage (for example, a ground voltage) to the power MISFET and the control circuit 47. The ENABLE electrode 52 transmits an electrical signal for enabling or disabling a portion or all of the functions of the control circuit 47. The SENSE electrode 53 transmits an electrical signal for detecting an abnormality of the control circuit 47.

The semiconductor device 1 includes a gate wiring 54 formed on the interlayer insulating layer 31. The gate wiring 54 is selectively routed to the output region 41 and the input region 42. The gate wiring 54 is electrically connected to the gate of the power MISFET 43 in the output region 41 and is electrically connected to the control circuit 47 in the input region 42. The gate wiring 54 transmits agate signal generated by the control circuit 47 to the gate of the power MISFET 43.

Figure 8:
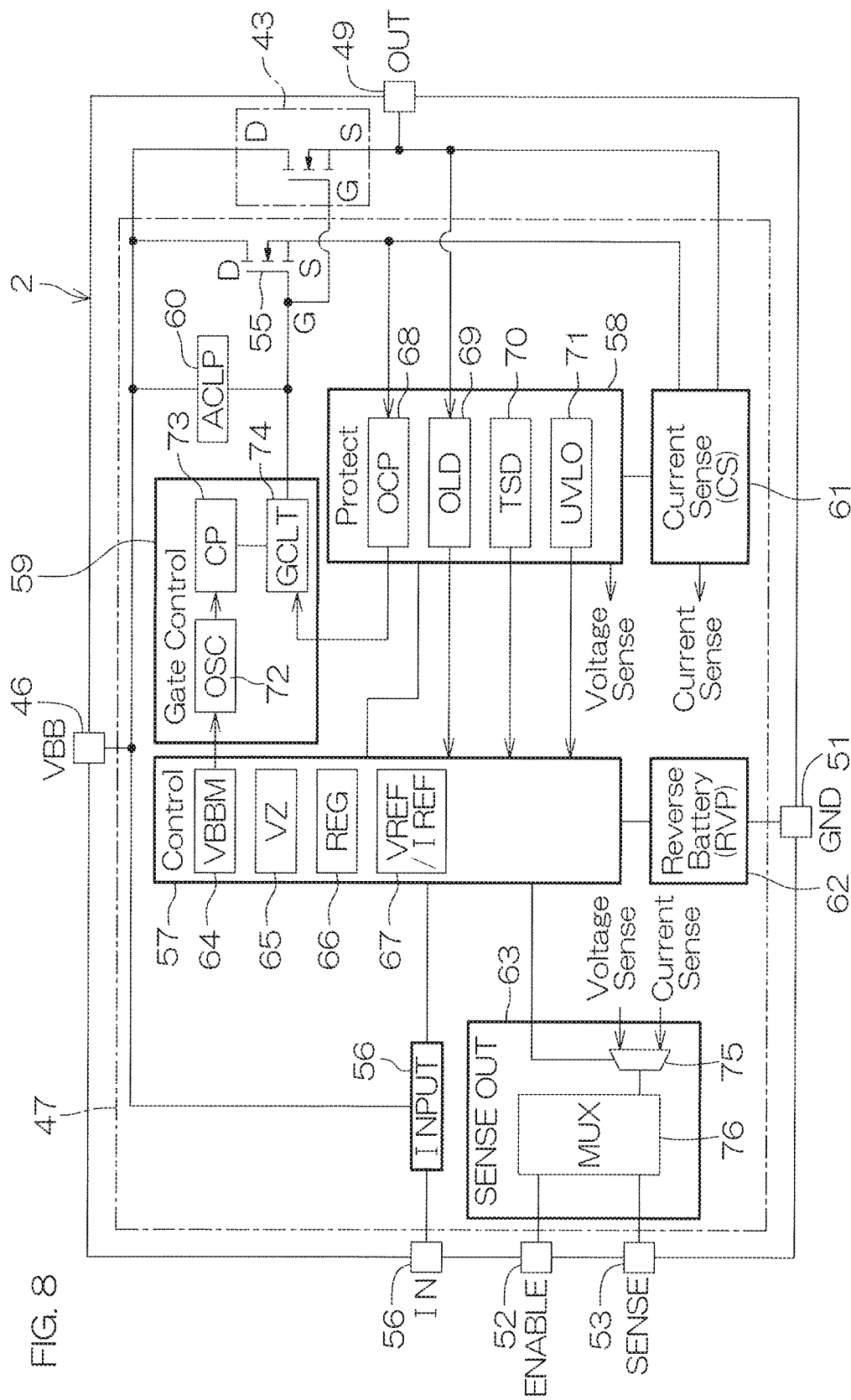
FIG. 8 is a diagram of an electrical configuration of the semiconductor device shown in FIG. 1.

FIG. 8 is a diagram of an electrical configuration of the semiconductor device 1 shown in FIG. 1. Although an embodiment example in which the semiconductor device 1 is a high side switching device shall be described below, the semiconductor device 1 is not restricted to a high side switching device. The semiconductor device 1 can also be provided as a low side switching device by adjustment of an electrical connection configuration and functions of the control circuit 47.

Referring to FIG. 8, the drain electrode 46 is connected to a power supply. The drain electrode 46 provides a power supply voltage VB to the power MISFET 43 and the control circuit 47. The power supply voltage VB may be not less than 10 V and not more than 20 V. The source electrode 49 is connected to a load.

The input electrode 50 may be connected to an MCU (micro controller unit), a DC/DC converter, an LDO (low drop out), etc. The input electrode 50 provides the input voltage to the control circuit 47. The input voltage may be not less than 1 V and not more than 10 V. The reference voltage electrode 51 is connected to a reference voltage wiring. The reference voltage electrode 51 provides the reference voltage to the power MISFET 43 and the control circuit 47. The ENABLE electrode 52 may be connected to the MCU. The SENSE electrode 53 may be connected to a resistor.

The gate of the power MISFET 43 is connected via the gate wiring 54 to the control circuit 47 (a gate control circuit 59 to be descried below). The drain of the power MISFET 43 is connected to the drain electrode 46. The source of the power MISFET 43 is connected to the control circuit 47 (a current detecting circuit 61 to be described below) and the source electrode 49.

The control circuit 47 includes a sensor MISFET 55, an input circuit 56, a current/voltage control circuit 57, a protection circuit 58, the gate control circuit 59, an active clamp circuit 60, the current detecting circuit 61, a power supply reverse connection protection circuit 62, and an abnormality detecting circuit 63.

A gate of the sensor MISFET 55 is connected to the gate control circuit 59. A drain of the sensor MISFET 55 is connected to the drain electrode 46. A source of the sensor MISFET 55 is connected to the current detecting circuit 61.

The input circuit 56 is connected to the input electrode 50 and the current/voltage control circuit 57. The input circuit 56 may include a Schmitt trigger circuit. The input circuit 56 shapes a waveform of an electrical signal applied to the input electrode 50. A signal generated by the input circuit 56 is input into the current/voltage control circuit 57.

The current/voltage control circuit 57 is connected to the protection circuit 58, the gate control circuit 59, the power supply reverse connection protection circuit 62, and the abnormality detecting circuit 63. The current/voltage control circuit 57 may include a logic circuit.

The current/voltage control circuit 57 generates various voltages in accordance with the electrical signal from the input circuit 56 and an electrical signal from the protection circuit 58. In this embodiment, the current/voltage control circuit 57 includes a drive voltage generating circuit 64, a first constant voltage generating circuit 65, a second constant voltage generating circuit 66, and a reference voltage/reference current generating circuit 67.

The drive voltage generating circuit 64 generates a drive voltage for driving the gate control circuit 59. The drive voltage may be set to a value with which a predetermined value is subtracted from the power supply voltage VB. The drive voltage generating circuit 64 may generate a drive voltage of not less than 5 V and not more than 15 V with which 5 V is subtracted from the power supply voltage VB. The drive voltage is input into the gate control circuit 59.

The first constant voltage generating circuit 65 generates a first constant voltage for driving the protection circuit 58. The first constant voltage generating circuit 65 may include a Zener diode or a regulator circuit (here, a Zener diode). The first constant voltage may be not less than 1 V and not more than 5 V. The first constant voltage is input into the protection circuit 58 (specifically, a load open detecting circuit 69, etc., to be described below).

The second constant voltage generating circuit 66 generates a second constant voltage for driving the protection circuit 58. The second constant voltage generating circuit 66 may include a Zener diode or a regulator circuit (here, a regulator circuit). The second constant voltage may be not less than 1 V and not more than 5 V. The second constant voltage is input into the protection circuit 58 (specifically, an overheat protection circuit 70 and a low-voltage malfunction suppressing circuit 71 to be described below).

The reference voltage/reference current generating circuit 67 generates a reference voltage and a reference current for various circuits. The reference voltage may be not less than 1 V and not more than 5 V. The reference current may be not less than 1 mA and not more than 1 A. The reference voltage and the reference current are input into the various circuits. If the various circuits include a comparator, the reference voltage and the reference current may be input into the comparator.

The protection circuit 58 is connected to the current/voltage control circuit 57, the gate control circuit 59, the abnormality detecting circuit 63, the source of the power MISFET 43, and the source of the sensor MISFET 55. The protection circuit 58 includes an overcurrent protection circuit 68, the load open detecting circuit 69, the overheat protection circuit 70, and the low-voltage malfunction suppressing circuit 71.

The overcurrent protection circuit 68 protects the power MISFET 43 from an overcurrent. The overcurrent protection circuit 68 is connected to the gate control circuit 59 and the source of the sensor MISFET 55. The overcurrent protection circuit 68 may include a current monitoring circuit. A signal generated by the overcurrent protection circuit 68 is input into the gate control circuit 59 (specifically, a drive signal output circuit 74 to be described below).

The load open detecting circuit 69 detects a short circuit state or an open state of the load. The load open detecting circuit 69 is connected to the current/voltage control circuit 57 and the source of the power MISFET 43. A signal generated by the load open detecting circuit 69 is input into the current/voltage control circuit 57.

The overheat protection circuit 70 monitors a temperature of the power MISFET 43 and protects the power MISFET 43 from excessive temperature rise. The overheat protection circuit 70 is connected to the current/voltage control circuit 57. The overheat protection circuit 70 includes a temperature sensing device. The temperature sensing device preferably has a temperature sensing diode that includes a pn junction diode. A signal generated by the overheat protection circuit 70 is input into the current/voltage control circuit 57.

The low-voltage malfunction suppressing circuit 71 suppresses malfunctioning of the power MISFET 43 when the power supply voltage VB is less than a predetermined value. The low-voltage malfunction suppressing circuit 71 is connected to the current/voltage control circuit 57. A signal generated by the low-voltage malfunction suppressing circuit 71 is input into the current/voltage control circuit 57.

The gate control circuit 59 controls an on state and an off state of the power MISFET 43 and an on state and an off state of the sensor MISFET 55. The gate control circuit 59 is connected to the current/voltage control circuit 57, the protection circuit 58, the gate of the power MISFET 43, and the gate of the sensor MISFET 55.

The gate control circuit 59 generates a gate signal corresponding to the number of the gate wiring 54 in accordance with an electrical signal from the current/voltage control circuit 57 and an electrical signal from the protection circuit 58. The gate signal is input via the gate wiring 54 into the gate of the power MISFET 43 and the gate of the sensor MISFET 55 respectively.

Specifically, the gate control circuit 59 includes an oscillating circuit 72, a charge pump circuit 73, and the drive signal output circuit 74. The oscillating circuit 72 oscillates in accordance with the electrical signal from the current/voltage control circuit 57 and generates a predetermined electrical signal. The electrical signal generated by the oscillating circuit 72 is input into the charge pump circuit 73. The charge pump circuit 73 boosts the electrical signal from the oscillating circuit 72. The electrical signal boosted by the charge pump circuit 73 is input into the drive signal output circuit 74.

The drive signal output circuit 74 generates the gate signal in accordance with the electrical signal from the charge pump circuit 73 and the electrical signal from the protection circuit 58 (specifically, the overcurrent protection circuit 68). The gate signal is input via the gate wiring 54 into the gate of the power MISFET 43 and the gate of the sensor MISFET 55. The sensor MISFET 55 and the power MISFET 43 are controlled at the same time by the gate control circuit 59.

The active clamp circuit 60 protects the power MISFET 43 from a back electromotive force. The active clamp circuit 60 is connected to the drain electrode 46, the gate of the power MISFET 43, and the gate of the sensor MISFET 55. The active clamp circuit 60 may include a plurality of diodes.

The active clamp circuit 60 may include a plurality of diodes that are bias connected to each other. The active clamp circuit 60 may include a plurality of diodes that are reverse-bias connected to each other. The active clamp circuit 60 may include a plurality of diodes that are bias connected to each other and a plurality of diodes that are reverse-bias connected to each other. The plurality of diodes may include a pn junction diode or a Zener diode or a pn junction diode and a Zener diode.

The current detecting circuit 61 detects a current flowing through the power MISFET 43 and the sensor MISFET 55. The current detecting circuit 61 is connected to the protection circuit 58, the abnormality detecting circuit 63, the source of the power MISFET 43, and the source of the sensor MISFET 55. The current detecting circuit 61 generates a current detection signal in accordance with an electrical signal generated by the power MISFET 43 and an electrical signal generated by the sensor MISFET 55. The current detection signal is input into the abnormality detecting circuit 63.

The power supply reverse connection protection circuit 62 protects the current/voltage control circuit 57, the power MISFET 43, etc., from a reverse voltage when a power supply is connected in reverse. The power supply reverse connection protection circuit 62 is connected to the reference voltage electrode 51 and the current/voltage control circuit 57.

The abnormality detecting circuit 63 monitors a voltage of the protection circuit 58. The abnormality detecting circuit 63 is connected to the current/voltage control circuit 57, the protection circuit 58, and the current detecting circuit 61. When an abnormality (variation of voltage, etc.) occurs in any of the overcurrent protection circuit 68, the load open detecting circuit 69, the overheat protection circuit 70, and the low-voltage malfunction suppressing circuit 71, the abnormality detecting circuit 63 generates an abnormality detection signal that is in accordance with the voltage of the protection circuit 58 and outputs it to the exterior.

Specifically, the abnormality detecting circuit 63 includes a first multiplexer circuit 75 and a second multiplexer circuit 76. The first multiplexer circuit 75 includes two input portions, one output portion, and one selection control input portion. The protection circuit 58 and the current detecting circuit 61 are respectively connected to the input portions of the first multiplexer circuit 75. The second multiplexer circuit 76 is connected to the output portion of the first multiplexer circuit 75. The current/voltage control circuit 57 is connected to the selection control input portion of the first multiplexer circuit 75.

The first multiplexer circuit 75 generates an abnormality detection signal in accordance with the electrical signal from the current/voltage control circuit 57, a voltage detection signal from the protection circuit 58, and the current detection signal from the current detecting circuit 61. The abnormality detection signal generated by the first multiplexer circuit 75 is input into the second multiplexer circuit 76.

The second multiplexer circuit 76 includes two input portions and one output portion. The output portion of the second multiplexer circuit 76 and the ENABLE electrode 52 are respectively connected to the input portions of the second multiplexer circuit 76. The SENSE electrode 53 is connected to the output portion of the second multiplexer circuit 76.

If the MCU is connected to the ENABLE electrode 52 and the resistor is connected to the SENSE electrode 53, an on signal is input from the MCU into the ENABLE electrode 52 and the abnormality detection signal is taken out from the SENSE electrode 53. The abnormality detection signal is converted to an electrical signal by the resistor connected to the SENSE electrode 53. A state abnormality of the semiconductor device 1 is detected based on this electrical signal.

Figure 9:
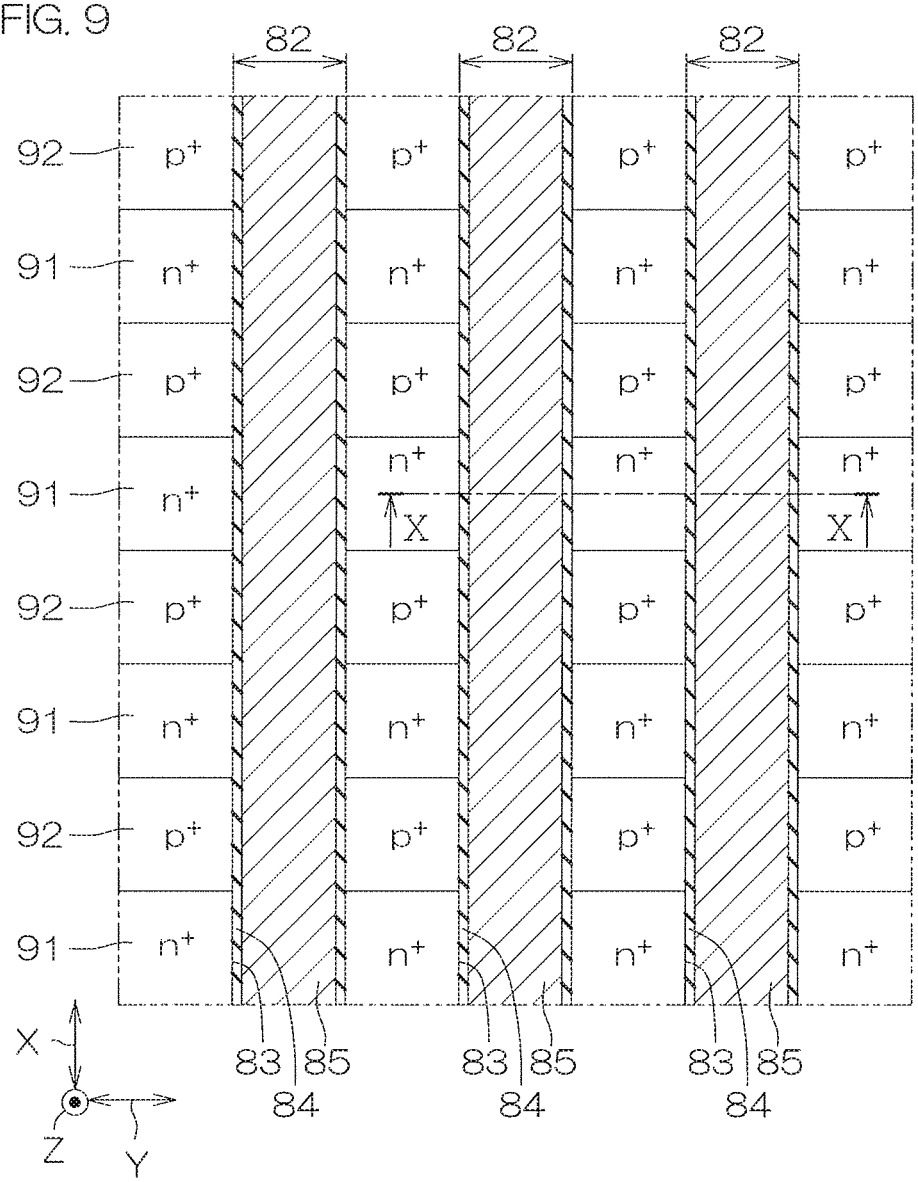
FIG. 9 is a plan view of a structure of a power MISFET shown in FIG. 8.
Figure 10:
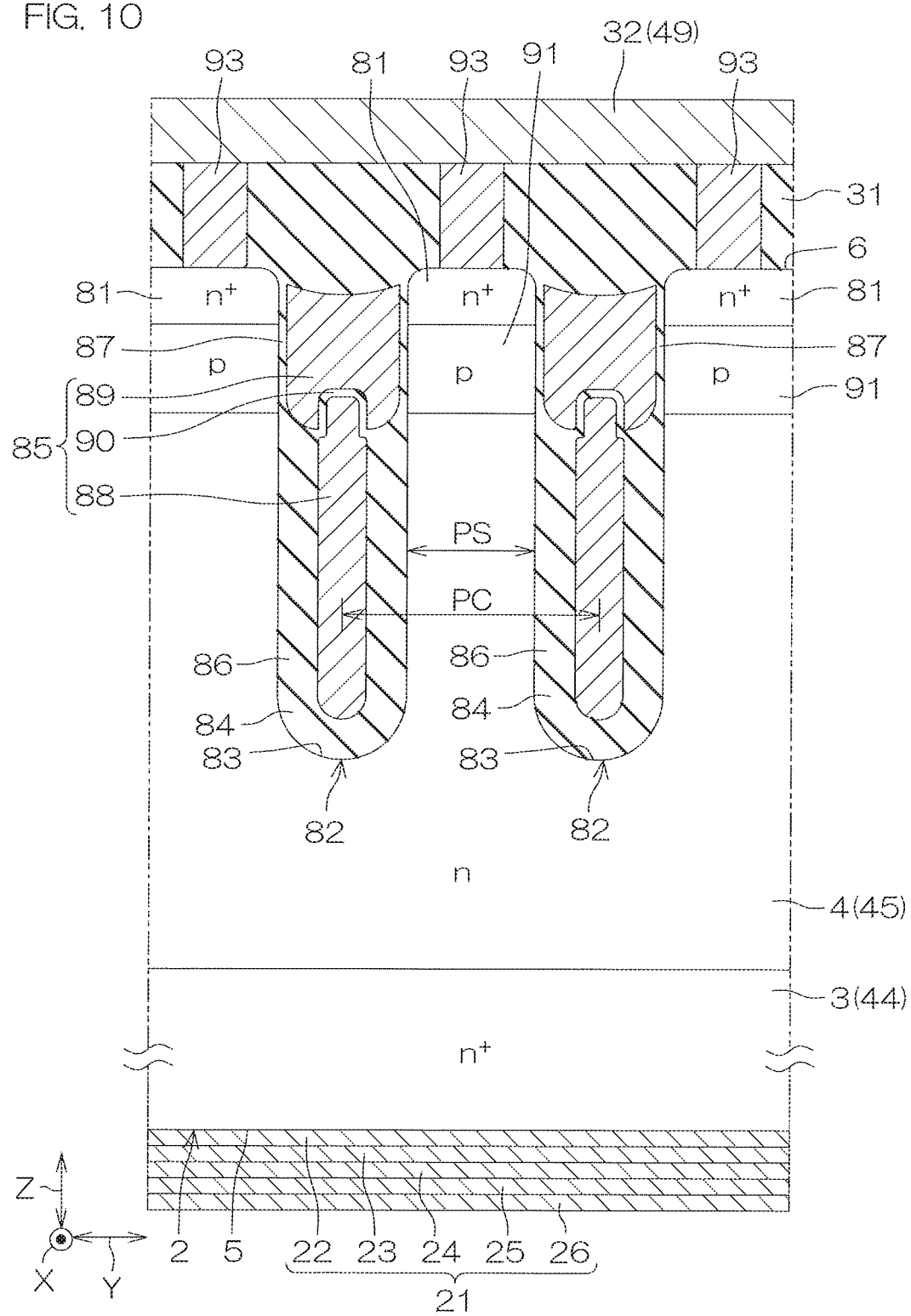
FIG. 10 is a sectional view taken along line X-X shown in FIG. 9.

FIG. 9 is a plan view of a structure of the power MISFET 43 shown in FIG. 8. FIG. 10 is a sectional view taken along line X-X shown in FIG. 9.

Referring to FIG. 9 and FIG. 10, the semiconductor device 1 includes a p-type body region 81 formed in a surface layer portion of the non-mounting surface 6 in the output region 41. A p-type impurity concentration of the body region 81 may be not less than $1\times10^{16}$ cm$^{-3}$ and not more than $1\times10^{18}$ cm$^{-3}$.

The body region 81 is formed in the drift region 45. A bottom portion of the body region 81 is formed in a region at the non-mounting surface 6 side with respect to a bottom portion of the drift region 45. A thickness of the body region 81 may be not less than 0.5 μm and not more than 2 μm. The thickness of the body region 81 may be not less than 0.5 μm and not more than 1 μm, not less than 1 μm and not more than 1.5 μm, or not less than 1.5 μm and not more than 2 μm.

The semiconductor device 1 includes a plurality of trench gate structures 82 formed in the non-mounting surface 6 in the output region 41. In plan view, the plurality of trench gate structures 82 respectively extend as bands along the first direction X and are formed at intervals in the second direction Y. The plurality of trench gate structures 82 are formed in stripes as a whole in plan view.

A pitch PS between the plurality of trench gate structures 82 may be not less than 0.1 μm and not more than 2 μm. The pitch PS is preferably not less than 0.3 μm and not more than 1.5 μm. A pitch PC between central portions of the plurality of trench gate structures 82 may be not less than 1 μm and not more than 8 μm. The pitch PC is preferably not less than 1 μm and not more than 3 μm.

Each trench gate structure 82 includes a gate trench 83, an insulating layer 84, and an embedded electrode 85. The gate trench 83 is formed by digging in toward the mounting surface 5 side from the non-mounting surface 6. The gate trench 83 penetrates through the body region 81.

The gate trench 83 includes a side wall and a bottom wall. The side wall of the gate trench 83 exposes the drift region 45 and the body region 81. The side wall of the gate trench 83 extends along the normal direction Z. The side wall of the gate trench 83 may be formed perpendicular to the non-mounting surface 6.

An absolute value of an angle that the side wall forms with the non-mounting surface 6 inside the chip 2 may exceed 90° and be not more than 95° (for example, approximately 91°). That is, the gate trench 83 may be formed in a tapered shape that narrows in opening width toward the bottom wall side from the non-mounting surface 6 side.

The bottom wall of the gate trench 83 is formed at an interval to the non-mounting surface 6 side from the bottom portion of the drift region 45. The bottom wall of the gate trench 83 exposes the drift region 45. The bottom wall of the gate trench 83 is formed in a curved shape (U shape) directed toward the bottom portion of the drift region 45. The bottom wall of the gate trench 83 is preferably formed at an interval of not less than 1 μm and not more than 5 μm from the bottom portion of the drift region 45.

A width of the gate trench 83 may be not less than 0.5 μm and not more than 2 μm. The width of the gate trench 83 is preferably not less than 0.8 μm and not more than 1.2 μm. A depth of the gate trench 83 may be not less than 1 μm and not more than 10 μm. The depth of the gate trench 83 is preferably not less than 2 μm and not more than 6 μm.

The insulating layer 84 is formed as a film along the inner wall of the gate trench 83. The insulating layer 84 demarcates a recess space inside the gate trench 83. A portion of the insulating layer 84 that covers the bottom wall of the gate trench 83 is formed in conformance to the bottom wall of the gate trench 83. The insulating layer 84 thereby demarcates a U-shaped space that is recessed in a U shape inside the gate trench 83.

The insulating layer 84 includes at least one of silicon oxide, silicon nitride, aluminum oxide, zirconium oxide, and tantalum oxide. In this embodiment, the insulating layer 84 has a single layer structure constituted of a silicon oxide layer.

The insulating layer 84 has a bottom side insulating layer 86 and an opening side insulating layer 87 that are formed in that order from the bottom wall side toward the non-mounting surface 6 side of the gate trench 83. The bottom side insulating layer 86 covers the inner wall at the bottom wall side of the gate trench 83. Specifically, the bottom side insulating layer 86 covers the inner wall at the bottom wall side of the gate trench 83 from the bottom portion of the body region 81. The bottom side insulating layer 86 demarcates the U-shaped space at the bottom wall side of the gate trench 83. A portion of the bottom side insulating layer 86 may contact the body region 81.

The opening side insulating layer 87 covers the inner wall at the opening side of the gate trench 83. Specifically, the opening side insulating layer 87 covers the side wall of the gate trench 83 in a region at the opening side of the gate trench 83 with respect to the bottom portion of the body region 81. The opening side insulating layer 87 contacts the body region 81. A portion of the opening side insulating layer 87 may contact the drift region 45.

The bottom side insulating layer 86 has a first thickness T1. The opening side insulating layer 87 has a second thickness T2 that is less than the first thickness T1. The first thickness T1 is a thickness along a normal direction of the inner wall of the gate trench 83 at the bottom side insulating layer 86. The second thickness T2 is a thickness along the normal direction of the inner wall of the gate trench 83 at the opening side insulating layer 87.

The embedded electrode 85 is embedded in the gate trench 83 across the insulating layer 84. In this embodiment, the embedded electrode 85 has a dielectric isolation type electrode structure that includes a bottom side electrode 88, an opening side electrode 89, and an intermediate insulating layer 90.

The bottom side electrode 88 is embedded at the bottom wall side of the gate trench 83 across the insulating layer 84. Specifically, the bottom side electrode 88 is embedded at the bottom wall side of the gate trench 83 across the bottom side insulating layer 86. The bottom side electrode 88 faces the drift region 45 across the bottom side insulating layer 86. A portion of the bottom side electrode 88 may face the body region 81 across the bottom side insulating layer 86.

The bottom side electrode 88 includes a lead-out portion that is led out to the opening of the gate trench 83 in an unillustrated region. The lead-out portion of the bottom side electrode 88 is electrically connected to the gate wiring 54 or the source electrode 49 in the unillustrated region.

The bottom side electrode 88 may include at least one of conductive polysilicon, tungsten, aluminum, copper, aluminum alloy, and copper alloy. In this embodiment, the bottom side electrode 88 includes conductive polysilicon. The conductive polysilicon may include an n-type impurity or a p-type impurity. The conductive polysilicon preferably includes an n-type impurity.

The opening side electrode 89 is embedded at the opening side of the gate trench 83 across the insulating layer 84. Specifically, the opening side electrode 89 is embedded, across the opening side insulating layer 87, in the recess space demarcated at the opening side of the gate trench 83. The opening side electrode 89 faces the body region 81 across the opening side insulating layer 87. A portion of the opening side electrode 89 may face the drift region 45 across the opening side insulating layer 87. The opening side electrode 89 is electrically connected to the gate wiring 54 in an unillustrated region.

The opening side electrode 89 may include at least one of conductive polysilicon, tungsten, aluminum, copper, aluminum alloy, and copper alloy. In this embodiment, the opening side electrode 89 includes conductive polysilicon. The conductive polysilicon may include an n-type impurity or a p-type impurity. The conductive polysilicon preferably includes an n-type impurity.

The intermediate insulating layer 90 is interposed between the bottom side electrode 88 and the opening side electrode 89 and electrically insulates the bottom side electrode 88 and the opening side electrode 89. Specifically, the intermediate insulating layer 90 covers an outer surface of the bottom side electrode 88 exposed from the bottom side insulating layer 86 in a region between the bottom side electrode 88 and the opening side electrode 89. The intermediate insulating layer 90 is continuous to the insulating layer 84 (bottom side insulating layer 86).

The intermediate insulating layer 90 has a third thickness T3. The third thickness T3 is less than the first thickness T1 of the bottom side electrode 88. The intermediate insulating layer 90 includes at least one of silicon oxide, silicon nitride, aluminum oxide, zirconium oxide, and tantalum oxide. In this embodiment, the intermediate insulating layer 90 has a single layer structure constituted of a silicon oxide layer.

When the power MISFET 43 is driven (that is, during on control of the gate), a gate voltage may be applied to the bottom side electrode 88 and the gate voltage may be applied to the opening side electrode 89. In this case, bottom side electrode 88 and the opening side electrode 89 function as gate electrodes. Voltage drop between the bottom side electrode 88 and the opening side electrode 89 can thereby be suppressed and therefore, decrease of withstand voltage due to concentration of electric field between the bottom side electrode 88 and the opening side electrode 89 can be suppressed. Also, an ON resistance of the chip 2 can be decreased and reduction of consumption power can thus be achieved.

When the power MISFET 43 is driven (that is, during the on control of the gate), the reference voltage may be applied to the bottom side electrode 88 and the gate voltage may be applied to the opening side electrode 89. In this case, while the bottom side electrode 88 functions as a field electrode, the opening side electrode 89 functions as a gate electrode. Parasitic capacitance can thereby be decreased and improvement of switching speed can thus be achieved.

The semiconductor device 1 includes a plurality of n$^+$-type source regions 91 formed in a surface layer portion of the body region 81. An n-type impurity concentration of the source regions 91 exceeds an n-type impurity concentration of the drift region 45. The n-type impurity concentration of the source regions 91 may be not less than $1 \times 10^{19}$ cm$^{-3}$ and not more than $1 \times 10^{21}$ cm$^{-3}$.

The plurality of source regions 91 are formed along the side walls of the gate trenches 83 in the surface layer portion of the body region 81. Bottom portions of the plurality of source regions 91 are positioned in a region at the non-mounting surface 6 side with respect to the bottom portion of the body region 81. The plurality of source regions 91 face the embedded electrodes 85 (opening side electrodes 89) across the insulating layers 84 (opening side insulating layers 87).

The plurality of source regions 91 are formed at intervals in the second direction Y in regions between the plurality of mutually adjacent gate trenches 83. Each source region 91 defines a channel of the power MISFET 43 inside the body region 81 with the drift region 45.

The semiconductor device 1 includes a plurality of p$^+$-type contact regions 92 formed in the surface layer portion of the body region 81. A p-type impurity concentration of the contact regions 92 exceeds the p-type impurity concentration of the body region 81. The p-type impurity concentration of the contact regions 92 may be not less than $1 \times 10^{19}$ cm$^{-3}$ and not more than $1 \times 10^{21}$ cm$^{-3}$.

The plurality of contact regions 92 are formed in regions between the plurality of source regions 91 in the surface layer portion of the body region 81. The plurality of contact regions 92 are thereby formed in the surface layer portion of the body region 81 in a mode of being arrayed alternately with respect to the plurality of source regions 91.

The semiconductor device 1 includes a plurality of plug electrodes 93 embedded in the interlayer insulating layer 31 in the output region 41. The plurality of plug electrodes 93 may include tungsten. The plurality of plug electrodes 93 include a plurality of plug electrodes 93 that are electrically connected to corresponding source regions 91 and contact regions 92. Also, the plurality of plug electrodes 93 include a plurality of plug electrodes 93 that are electrically connected respectively to corresponding bottom side electrodes 88. Also, the plurality of plug electrodes 93 include plug electrodes 93 that are electrically connected respectively to corresponding opening side electrodes 89.

The source electrode 49 is electrically connected via a corresponding plurality of plug electrodes 93 to the source regions 91 and the contact regions 92. The source electrode 49 may be electrically connected via a corresponding plurality of plug electrodes 93 to the opening side electrodes 89. The gate wiring 54 is electrically connected via a corresponding plurality of plug electrodes 93 to the bottom side electrodes 88 and/or the opening side electrodes 89.

Figure 11:
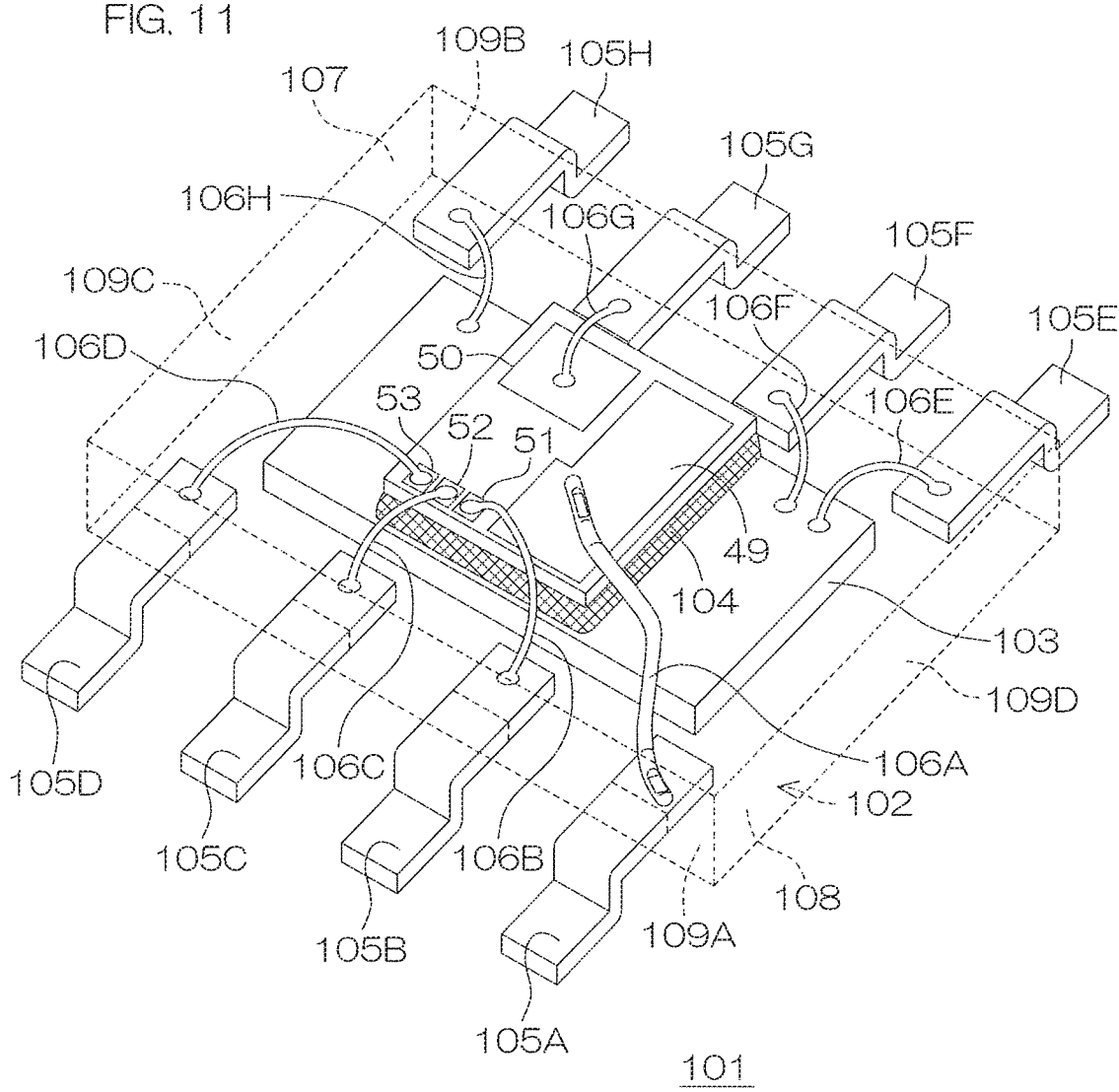
FIG. 11 is a perspective view of a semiconductor package incorporating the semiconductor device shown in FIG. 1 as seen through a package main body.
Figure 12:
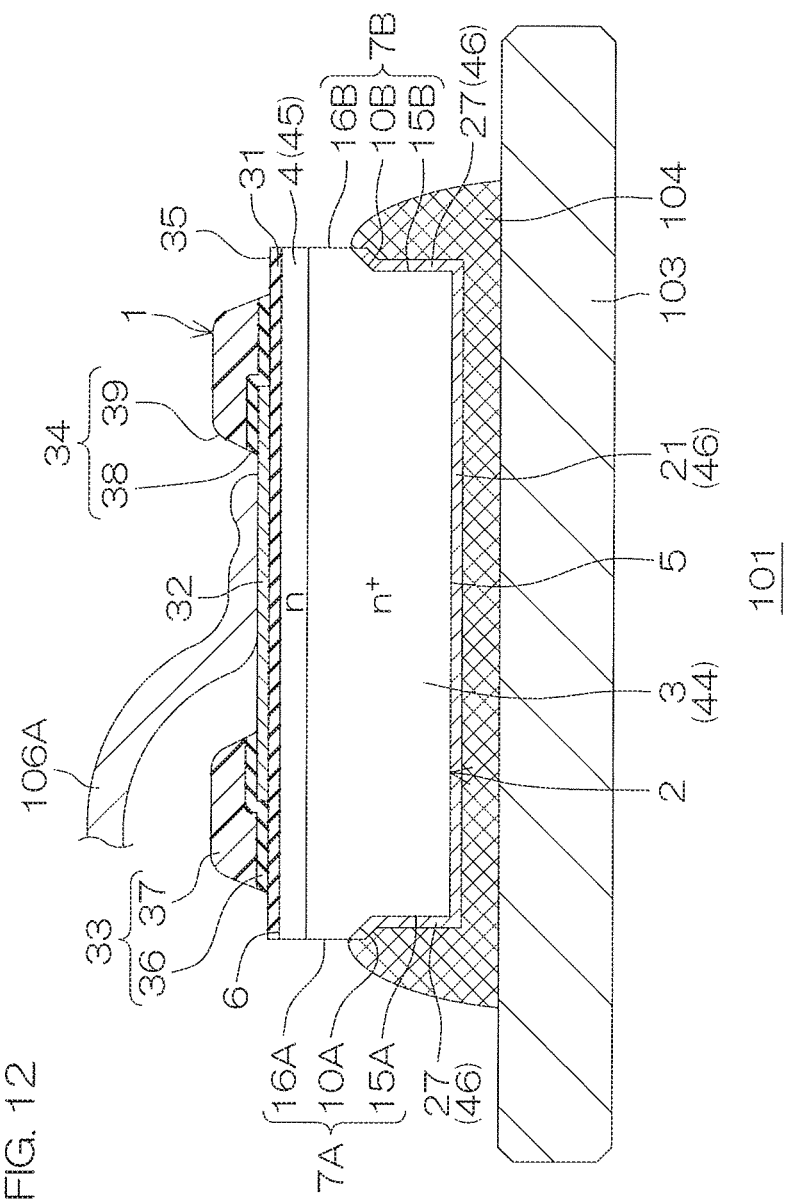
FIG. 12 is a sectional view of a bonding state of the semiconductor device shown in FIG. 11.

FIG. 11 is a perspective view of a semiconductor package 101 incorporating the semiconductor device 1 shown in FIG. 1 as seen through a package main body 102. FIG. 12 is a sectional view of a bonding state of the semiconductor device 1 shown in FIG. 11.

Referring to FIG. 11 and FIG. 12, the semiconductor package 101 is a so-called SOP (small outline package) in this embodiment. The semiconductor package 101 includes the package main body 102, a die pad 103, the semiconductor device 1, the conductive bonding material 104, a plurality (eight in this embodiment) of lead terminals 105, and a plurality (eight in this embodiment) of lead wires 106.

The package main body 102 is constituted of a mold resin. The package main body 102 may include an epoxy resin as an example of the molded resin. The package main body 102 is formed in a rectangular parallelepiped shape. The package main body 102 includes a first principal surface 107 at one side, a second principal surface 108 at the other side, and four side surfaces 109A, 109B, 109C, and 109D connecting the first principal surface 107 and the second principal surface 108.

Specifically, the four side surfaces 109A to 109D include the first side surface 109A, the second side surface 109B, the third side surface 109C, and the fourth side surface 109D. The first side surface 109A and the second side surface 109B face each other. The third side surface 109C and the fourth side surface 109D face each other.

The die pad 103 is arranged inside the package main body 102. The die pad 103 may be exposed from the second principal surface 108. The die pad 103 is constituted of a metal plate that is formed in a rectangular parallelepiped shape. The die pad 103 may include at least one of Fe, Au, Ag, Cu, and Al. The die pad 103 may have an outer surface on which is formed at least one of a Ni plating film, an Au plating film, an Ag plating film, and a Cu plating film.

The plurality of lead terminals 105 include a first lead terminal 105A, a second lead terminal 105B, a third lead terminal 105C, a fourth lead terminal 105D, a fifth lead terminal 105E, a sixth lead terminal 105F, a seventh lead terminal 105G, and an eighth lead terminal 105H. The number of the lead terminals 105 is adjusted in accordance with the functions of the semiconductor device 1 and is not restricted to the number shown in FIG. 11 and FIG. 12.

The four lead terminals 105A to 105D are arranged at the first side surface 109A side of the package main body 102. The four lead terminals 105A to 105D are arranged at intervals from the die pad 103. The four lead terminals 105A to 105D are aligned at intervals in a direction in which the first side surface 109A extends. The four lead terminals 105A to 105D cross the first side surface 109A from inside the package main body 102 and are led outside the package main body 102.

The four lead terminals 105E to 105H are arranged at the second side surface 109B side of the package main body 102. The four lead terminals 105E to 105H are arranged at intervals from the die pad 103. The four lead terminals 105E to 105H are aligned at intervals in a direction in which the second side surface 109B extends. The four lead terminals 105E to 105H cross the second side surface 109B from inside the package main body 102 and are led outside the package main body 102.

The plurality of lead terminals 105 may include at least one of Fe, Au, Ag, Cu, and Al. The plurality of lead terminals 105 may each have an outer surface on which is formed at least one of a Ni plating film, an Au plating film, an Ag plating film, and a Cu plating film.

The semiconductor device 1 is arranged on the die pad 103 in an orientation where the mounting surface 5 faces the die pad 103. The conductive bonding material 104 is interposed between the semiconductor device 1 and the die pad 103 and bonds the drain electrode 46 of the semiconductor device 1 to the die pad 103. Specifically, the conductive bonding material 104 is interposed between the first metal layer 21 and the die pad 103 and covers the second metal layer 27.

The conductive bonding material 104 covers the mounting surface 5 via the first metal layer 21. The conductive bonding material 104 covers the entirety of the mounting surface 5 via the first metal layer 21. The conductive bonding material 104 covers the second metal layer 27 at an interval to the mounting surface 5 side from the non-mounting surface 6. The conductive bonding material 104 covers the first connecting walls 15A to 15D and the eaves portions 10A to 10D via the second metal layer 27.

The conductive bonding material 104 exposes the second connecting walls 16A to 16D. That is, the conductive bonding material 104 exposes the epitaxial layer 4. The affinity (wetting property) of the conductive bonding material 104 with respect to the chip 2 is less than the affinity (wetting property) of the conductive bonding material 104 with respect to the second metal layer 27. The conductive bonding material 104 can thus be suppressed from wet-spreading to the second connecting walls 16A to 16D.

Variations in the electrical properties of the epitaxial layer 4 due to the conductive bonding material 104 can thereby be suppressed and therefore, variations in the electrical characteristics of the functional devices formed in the epitaxial layer 4 can be suppressed appropriately.

The conductive bonding material 104 is constituted of solder or conductive paste. The solder may be lead-free solder. The solder may include at least one of SnAgCu, SnZnBi, SnCu, SnCuNi, and SnSbNi. The metal paste may include at least one of Au, Ag, and Cu.

The conductive bonding material 104 is preferably constituted of silver paste. The silver paste is especially preferably constituted of sintered silver paste. The sintered silver paste is constituted of a paste with which Ag particles of nano size or micro size are dispersed in an organic solvent.

Heat generated at the semiconductor device 1 is transmitted to the conductive bonding material 104 via the first metal layer 21 and the second metal layer 27. The heat transmitted to the conductive bonding material 104 is transmitted to the die pad 103. Temperature rise of the semiconductor device 1 can thereby be suppressed. If the die pad 103 is exposed from the second principal surface 108 of the package main body 102, the heat of the die pad 103 can be dissipated efficiently outside the package main body 102. The temperature rise of the semiconductor device 1 can thus be suppressed appropriately.

The plurality of lead wires 106 include a first lead wire 106A, a second lead wire 106B, a third lead wire 106C, a fourth lead wire 106D, a fifth lead wire 106E, a sixth lead wire 106F, a seventh lead wire 106G, and an eighth lead wire 106H. The number of the lead wires 106 is adjusted according to the functions of the semiconductor device 1 and is not restricted to the number shown in FIG. 11 and FIG. 12.

The first lead wire 106A is electrically connected to one end portion of the first lead terminal 105A and the source electrode 49. In this embodiment, the first lead wire 106A is constituted of an aluminum wire as an example of a bonding wire. The first lead wire 106A may be constituted of a gold wire or a copper wire in place of the aluminum wire.

The second lead wire 106B is electrically connected to one end portion of the second lead terminal 105B and the reference voltage electrode 51. The third lead wire 106C is electrically connected to one end portion of the third lead terminal 105C and the ENABLE electrode 52. The fourth lead wire 106D is electrically connected to one end portion of the fourth lead terminal 105D and the SENSE electrode 53.

The fifth lead wire 106E is electrically connected to one end portion of the fifth lead terminal 105E and the die pad 103. The sixth lead wire 106F is electrically connected to one end portion of the sixth lead terminal 105F and the die pad 103. The seventh lead wire 106G is electrically connected to one end portion of the seventh lead terminal 105G and the input electrode 50. The eighth lead wire 106H is electrically connected to one end portion of the eighth lead terminal 105H and the die pad 103.

In this embodiment, the second to eighth lead wires 106B to 106H are each constituted of a gold wire or a copper wire as an example of a bonding wire. In this embodiment, the second to eighth lead wires 106B to 106H may each be constituted of an aluminum wire. A connection configuration of the plurality of lead wires 106 with respect to the die pad 103, the semiconductor device 1, and the plurality of lead terminals 105A to 105H is arbitrary and not restricted to the connection configuration shown in FIG. 11 and FIG. 12.

In regard to the form of the semiconductor package 101, a form other than SOP can also be adopted. The semiconductor package 101 may have the form of a TO (transistor outline), a QFN (quad for non lead package), a DFP (dual flat package), a DIP (dual inline package), a QFP (quad flat package), an SIP (single inline package), an SOJ (small outline J-leaded package), or any of various forms related to these.

As described above, the semiconductor device 1 has the side walls 7A to 7D that include the eaves portions 10A to 10D. Thereby, flowing around of the conductive bonding material 104 to the non-mounting surface 6 can be suppressed by the eaves portions 10A to 10D. Also, the semiconductor device 1 includes, in addition to the first metal layer 21 that covers the mounting surface 5, the second metal layer 27 that covers the side walls 7A to 7D. The second metal layer 27 covers the side walls 7A to 7D at intervals to the mounting surface 5 side from the non-mounting surface 6.

Heat dissipation can thereby be improved appropriately. The heat dissipation of the semiconductor device 1 can be improved further by forming the conductive bonding material 104 that covers the second metal layer 27 inside the semiconductor package 101.

FIG. 13A to FIG. 13L are sectional views for describing an example of a method for manufacturing the semiconductor device 1 shown in FIG. 1. In the following, steps of forming the functional devices are omitted.

Referring to FIG. 13A, a wafer 111 made of silicon is prepared. The wafer 111 includes a first wafer principal surface 112 at one side and a second wafer principal surface 113 at the other side. The first wafer principal surface 112 and the second wafer principal surface 113 correspond respectively to the mounting surface 5 and the non-mounting surface 6 of the chip 2.

The wafer 111 has a laminated structure that includes the substrate 3 and the epitaxial layer 4. The epitaxial layer 4 is formed epitaxially growing silicon from a principal surface of the substrate 3 by an epitaxial growth method.

Referring to FIG. 13B, the interlayer insulating layer 31 is formed on the first wafer principal surface 112. The interlayer insulating layer 31 may be formed by a thermal oxidation treatment method and/or a CVD (chemical vapor deposition) method.

Referring to FIG. 13C, a base electrode 114 that is to be a base of the plurality of electrodes 32 is formed on the interlayer insulating layer 31. The base electrode 114 may be formed by a sputter method and/or a plating method.

Referring to FIG. 13D, a resist mask 115 having a predetermined pattern is formed on the base electrode 114. Next, unnecessary portions of the base electrode 114 are removed by an etching method via the resist mask 115. The etching method may be a wet etching method and/or a dry etching method. The base electrode 114 is thereby divided into the plurality of electrodes 32. The resist mask 115 is thereafter removed.

Referring to FIG. 13E, a base insulating layer 116 that is to be a base of the top insulating layers 33 is formed on the interlayer insulating layer 31. The base insulating layer 116 has a laminated structure that includes the passivation layer 36 and the resin layer 37. The passivation layer 36 includes silicon nitride. The passivation layer 36 may be formed by a CVD method. The resin layer 37 includes the photosensitive resin (polybenzoxazole in this embodiment). The resin layer 37 may be formed by coating the photosensitive resin onto the passivation layer 36.

Figure 13F:
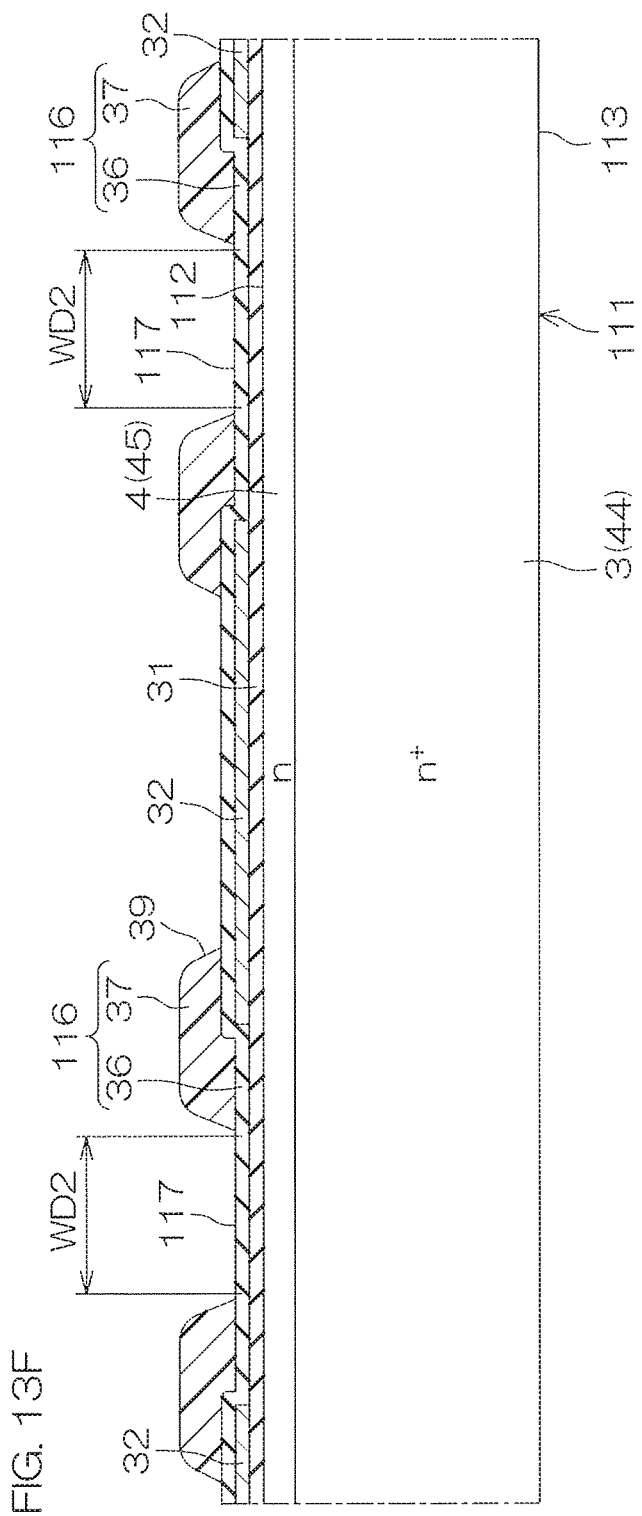
FIG. 13A to FIG. 13L are sectional views for describing an example of a method for manufacturing the semiconductor device shown in FIG. 1.

Referring to FIG. 13F, the resin layer 37 is selectively exposed and thereafter developed. The second openings 39 and a dicing street 117 are thereby formed in the resin layer 37.

Figure 13G:
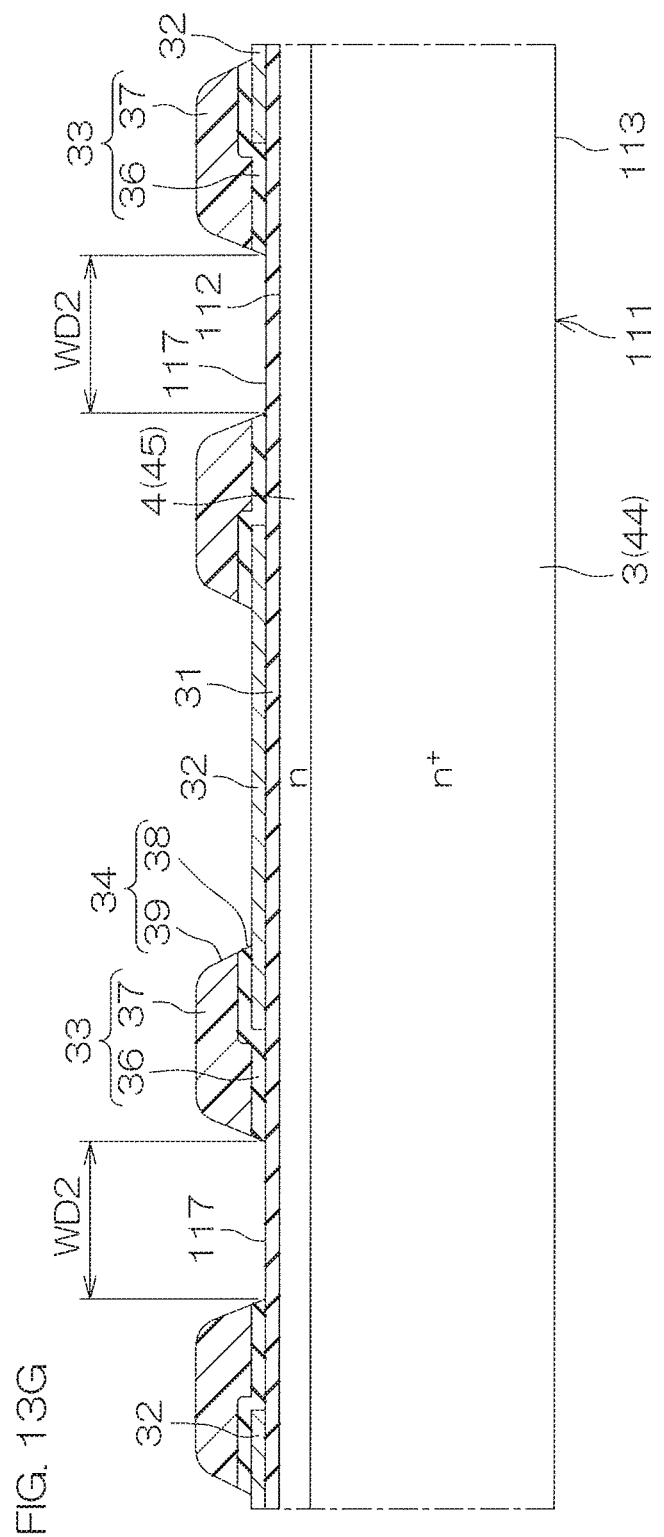

Referring to FIG. 13G, portions of the passivation layer 36 exposed from the resin layer 37 are removed by an etching method via the resin layer 37. The etching method may be a wet etching method and/or a dry etching method. The first openings 38 and the dicing street 117 are thereby formed in the passivation layer 36.

Thus, the plurality of pad openings 34 and the dicing street 117 are formed in the base insulating layer 116 and at the same time, the base insulating layer 116 is divided into a plurality of the top insulating layers 33. The plurality of pad openings 34 are each formed by a first opening 38 and a second opening 39. The plurality of pad openings 34 each expose a corresponding electrode 32. The dicing street 117 is demarcated by the peripheral edges of the plurality of top insulating layers 33 and formed in a lattice in plan view.

A width WD2 of the dicing street 117 may be not less than 2 µm and not more than 200 µm. The width WD2 is a width in a direction orthogonal to a direction in which the dicing street 117 extends. The width WD2 may be not less than 2 µm and not more than 50 µm, not less than 50 µm and not more than 100 µm, not less than 100 µm and not more than 150 µm, or not less than 150 µm and not more than 200 µm.

Figure 13H:
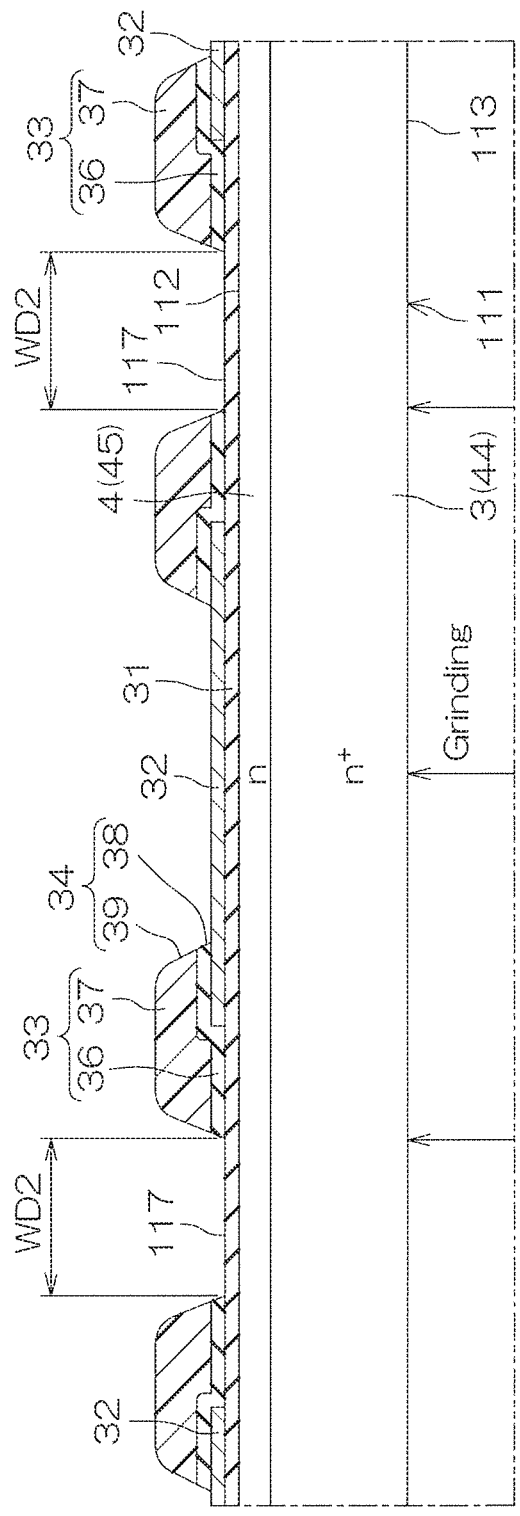
Figure 13:
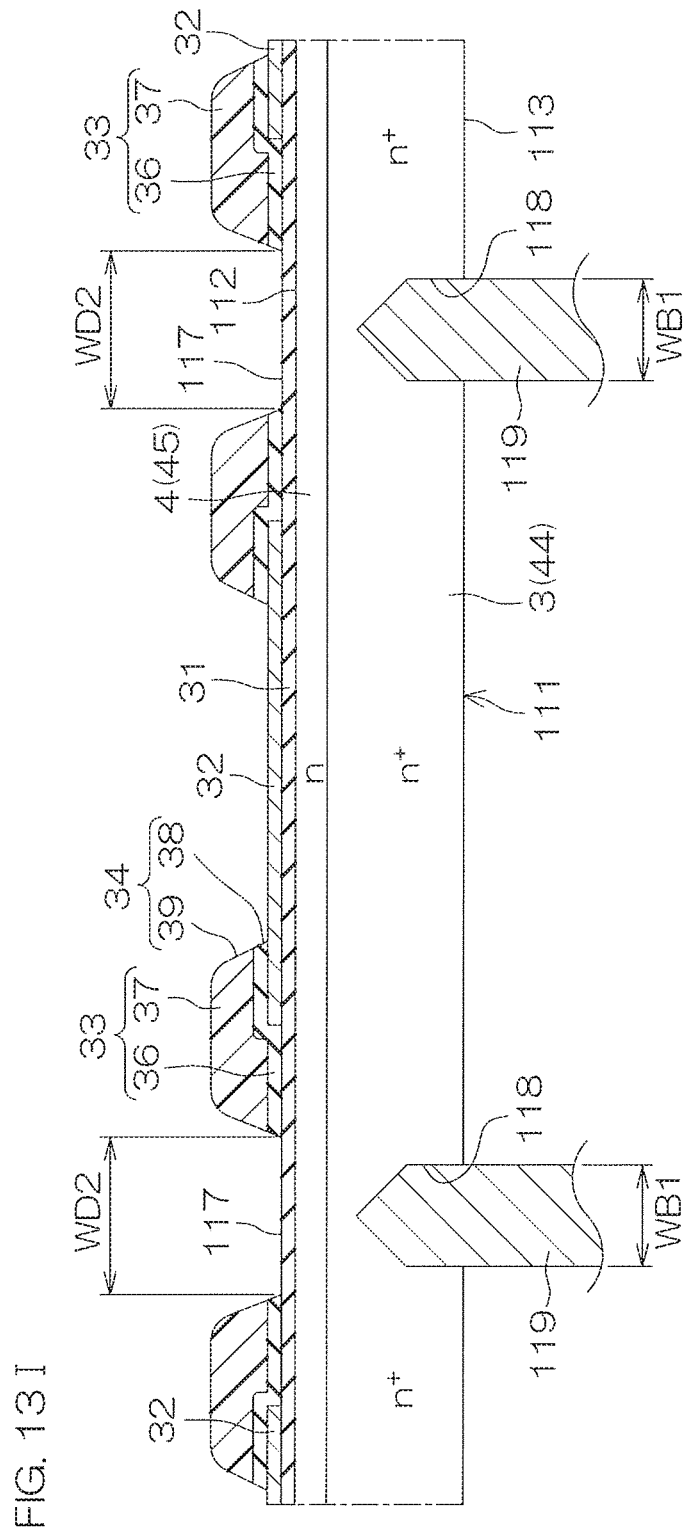

Referring to FIG. 13H, the second wafer principal surface 113 is ground. The second wafer principal surface 113 may be ground by a CMP (chemical mechanical polishing) method. The wafer 111 (substrate 3) is thereby thinned to a desired thickness.

Referring to FIG. 13I, a groove 118 is formed in the second wafer principal surface 113. The groove 118 is formed in a lattice oriented along the dicing street 117 in plan view. The groove 118 demarcates regions of the wafer 111 to be the semiconductor devices 1 from the second wafer principal surface 113 side. In this step, the groove 118 is formed by a grinding method using a first blade 119 having a first blade width WB1. The first blade width WB1 is preferably less than the width WD2 of the dicing street 117.

The groove 118 may be formed by an etching method in place of or in addition to the grinding method. If the groove 118 is formed by an etching method, first, a resist mask (not shown) having an opening that exposes a region in which the groove 118 is to be formed is formed on the second wafer principal surface 113. Next, an unnecessary portion of the second wafer principal surface 113 is removed by the etching method via the resist mask (not shown).

The etching method may be a wet etching method and/or a dry etching method. The etching method is preferably a dry etching method (for example, a reactive ion etching method). The groove 118 is thereby formed in the second wafer principal surface 113. The resist mask (not shown) is thereafter removed.

Referring to FIG. 13J, the second wafer principal surface 113 and an inner wall of the groove 118 may be roughened by a roughening etching method. The roughening etching method may be a wet etching method and/or a dry etching method. The roughening etching method is preferably a wet etching method.

Figure 13K:
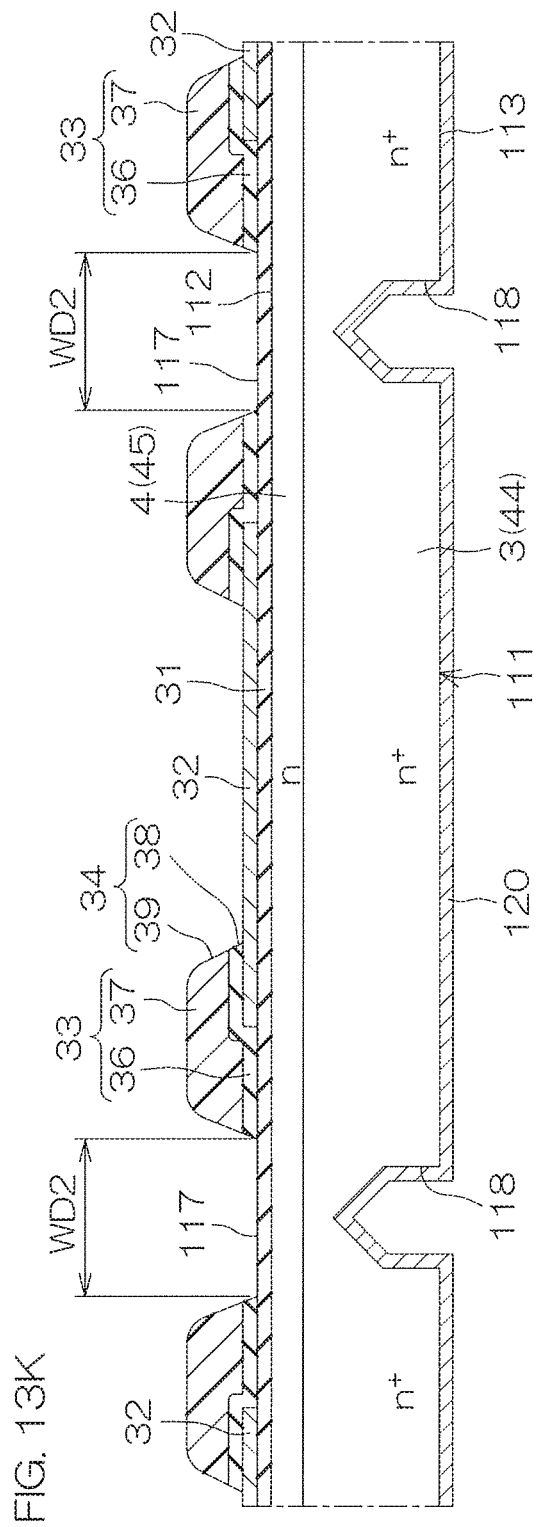

Referring to FIG. 13K, a base metal layer 120 that is to be a base of the first metal layer 21 and the second metal layer 27 is formed on the second wafer principal surface 113. The base metal layer 120 is formed as a film along the second wafer principal surface 113 and the inner wall of the groove 118. The base metal layer 120 thereby demarcates a recess space inside the groove 118.

In this embodiment, the base metal layer 120 has a laminated structure that includes the Ti layer 22, the Ni layer 23, the Au layer 24, the Pd layer 25, and the Ag layer 26. The Ti layer 22, the Ni layer 23, the Au layer 24, the Pd layer 25, and the Ag layer 26 may each be formed by a sputter method, a vapor deposition method, and/or a plating method.

The base metal layer 120 covers the second wafer principal surface 113 and the inner wall of the groove 118 that have been roughened. An adhesion force of the base metal layer 120 to the second wafer principal surface 113 and the inner wall of the groove 118 can thereby be increased and peeling of the base metal layer 120 from the second wafer principal surface 113 and the inner wall of the groove 118 can thus be suppressed appropriately.

Figure 13L:
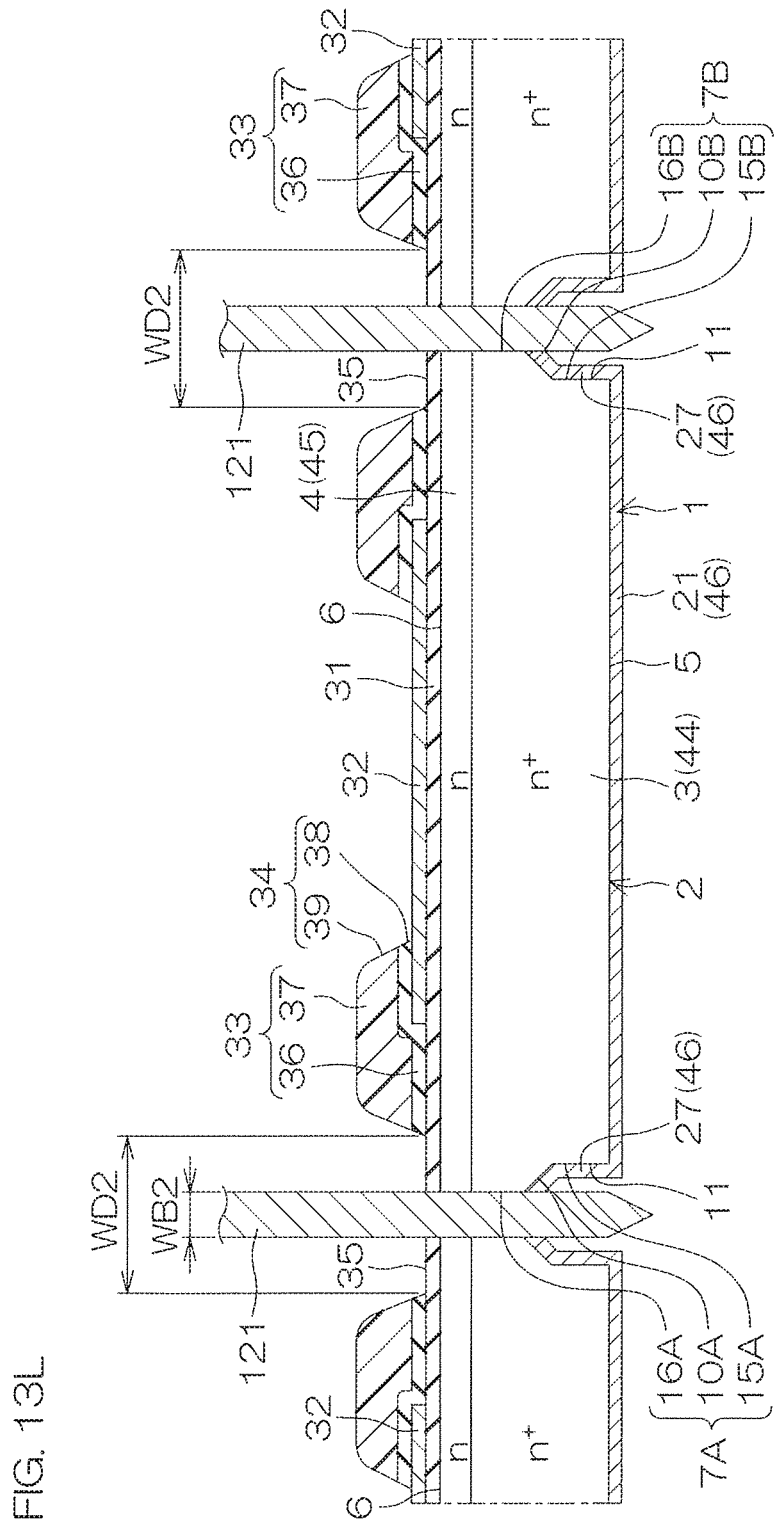

Referring to FIG. 13L, the wafer 111 is cut along the dicing street 117 and divided into a plurality of the semiconductor devices 1. In this step, the wafer 111 is cut by a grinding method using a second blade 121 having a second blade width WB2 less than the first blade width WB1. The wafer 111 is cut from the first wafer principal surface 112 side by the second blade 121. The semiconductor device 1 is manufactured through steps including the above.

Steps from FIG. 13G onward shall now be described in detail with reference to FIG. 14A to FIG. 14G. FIG. 14A to FIG. 14G are sectional views of steps from FIG. 13G onward and are sectional views for describing the method for manufacturing the semiconductor device 1 shown in FIG. 1 in more detail.

Figure 14A:
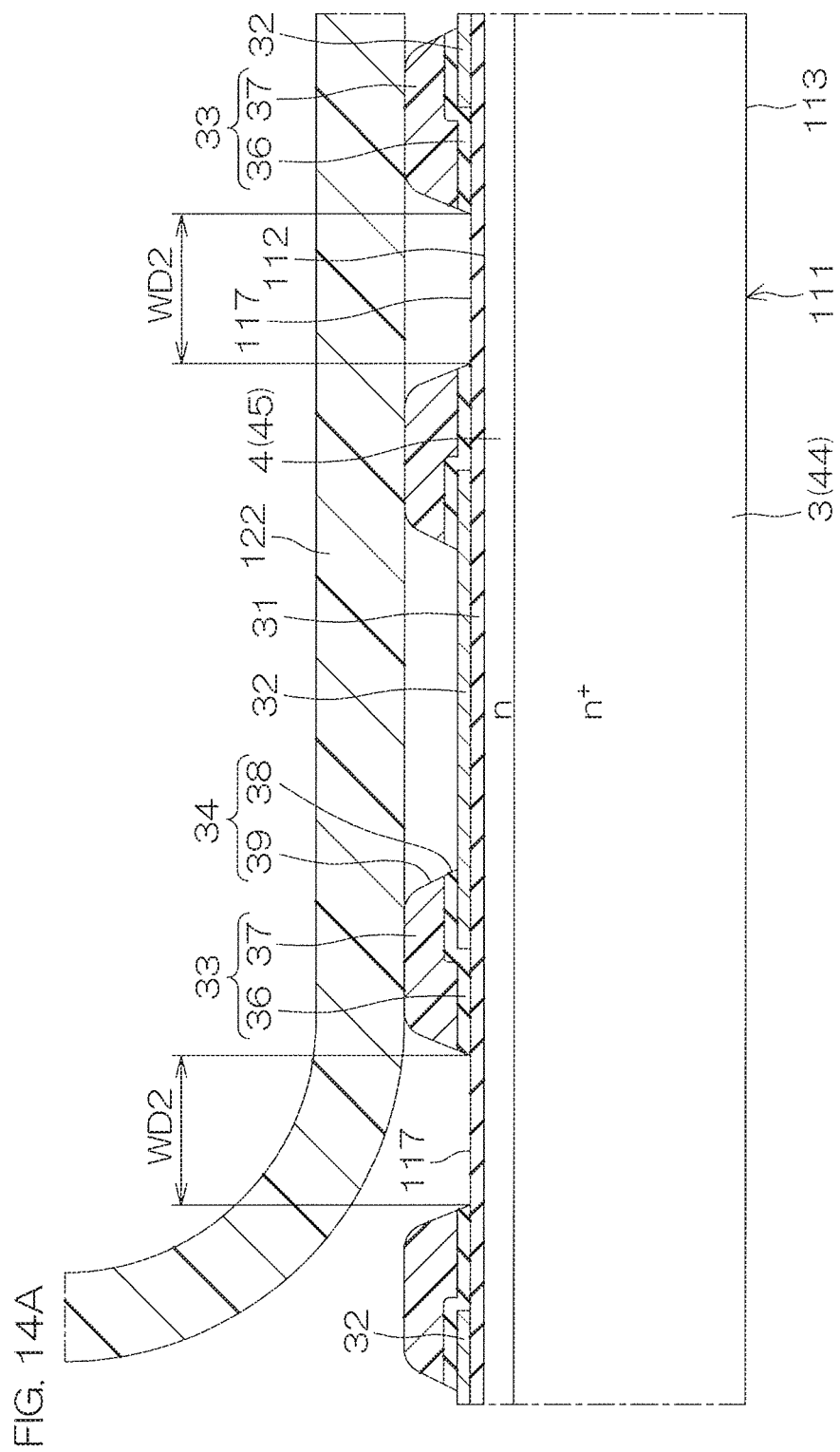

Referring to FIG. 14A, after the passivation layer 36 is removed in the step of FIG. 13G, a first support tape 122 is stuck onto the first wafer principal surface 112 side. The first support tape 122 is preferably constituted of an ultraviolet curable one-sided tacky tape. The first support tape 122 may, for example, be a back grinding tape that includes a base film including an ultraviolet transmitting resin and a tacky agent layer provided at one surface side of the base film and including an ultraviolet curable resin.

Figure 14B:
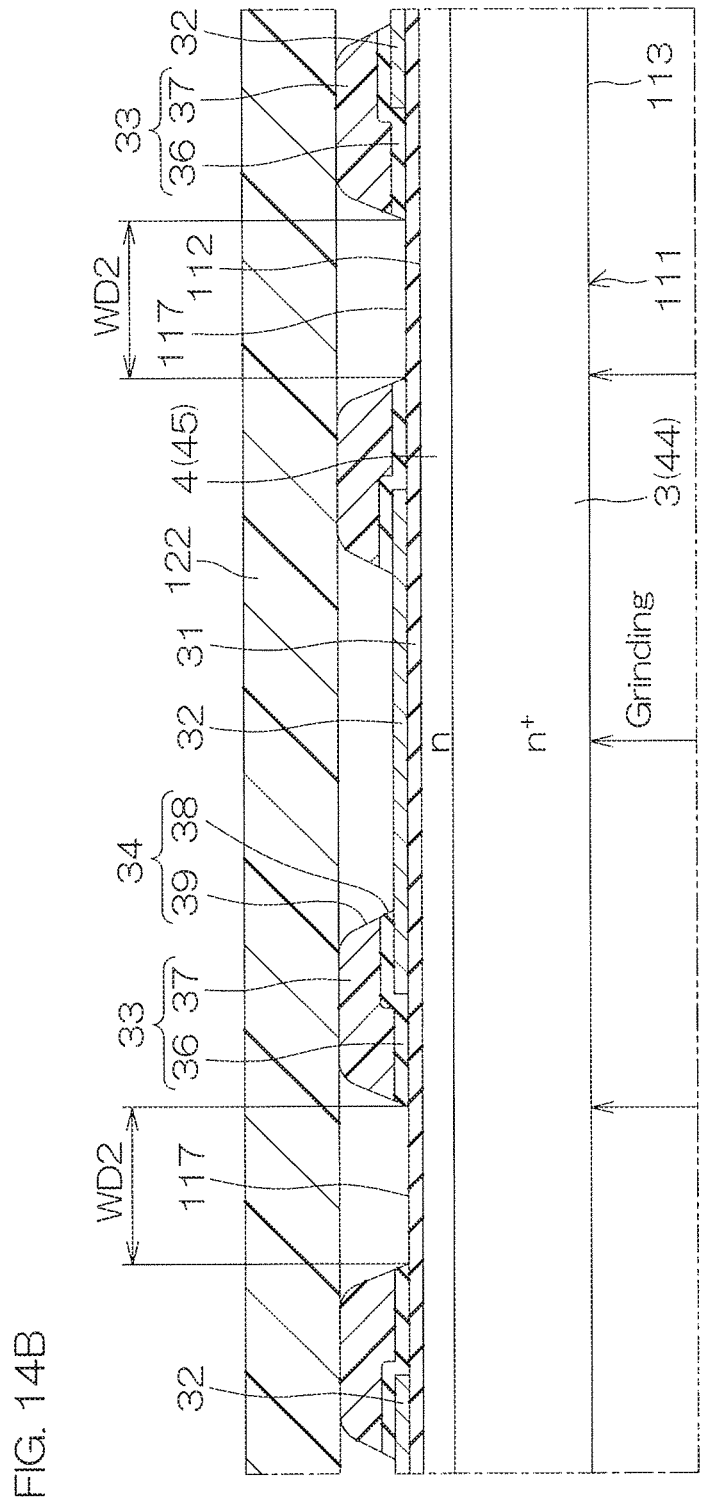

Referring to FIG. 14B, the second wafer principal surface 113 is ground in a state where the wafer 111 is supported by the first support tape 122. The second wafer principal surface 113 may be ground by a CMP method. The wafer 111 (substrate 3) is thereby thinned to the desired thickness.

Referring to FIG. 14C, the groove 118 is formed in the second wafer principal surface 113 in the state where the wafer 111 is supported by the first support tape 122. The groove 118 is formed in a lattice oriented along the dicing street 117 in plan view. The groove 118 demarcates the regions of the wafer 111 to be the semiconductor devices 1 from the second wafer principal surface 113 side. In this step, the groove 118 is formed by the grinding method using the first blade 119 having the first blade width WB1. The first blade width WB1 is preferably less than the width WD2 of the dicing street 117. After the groove 118 is formed, ultraviolet rays are irradiated onto the first support tape 122 and the first support tape 122 is peeled off.

Obviously, the groove 118 may be formed by an etching method in place of or in addition to the grinding method. In this case, for example, the resist mask (not shown) having the opening that exposes the region in which the groove 118 is to be formed is formed on the second wafer principal surface 113 in the state where the wafer 111 is supported by the first support tape 122. Next, the unnecessary portion of the second wafer principal surface 113 is removed by the etching method via the resist mask (not shown).

The etching method may be a wet etching method and/or a dry etching method. The etching method is preferably a dry etching method (for example, a reactive ion etching method). The groove 118 is thereby formed in the second wafer principal surface 113. After the groove 118 is formed, the first support tape 122 and the resist mask (not shown) are removed.

Figure 14D:
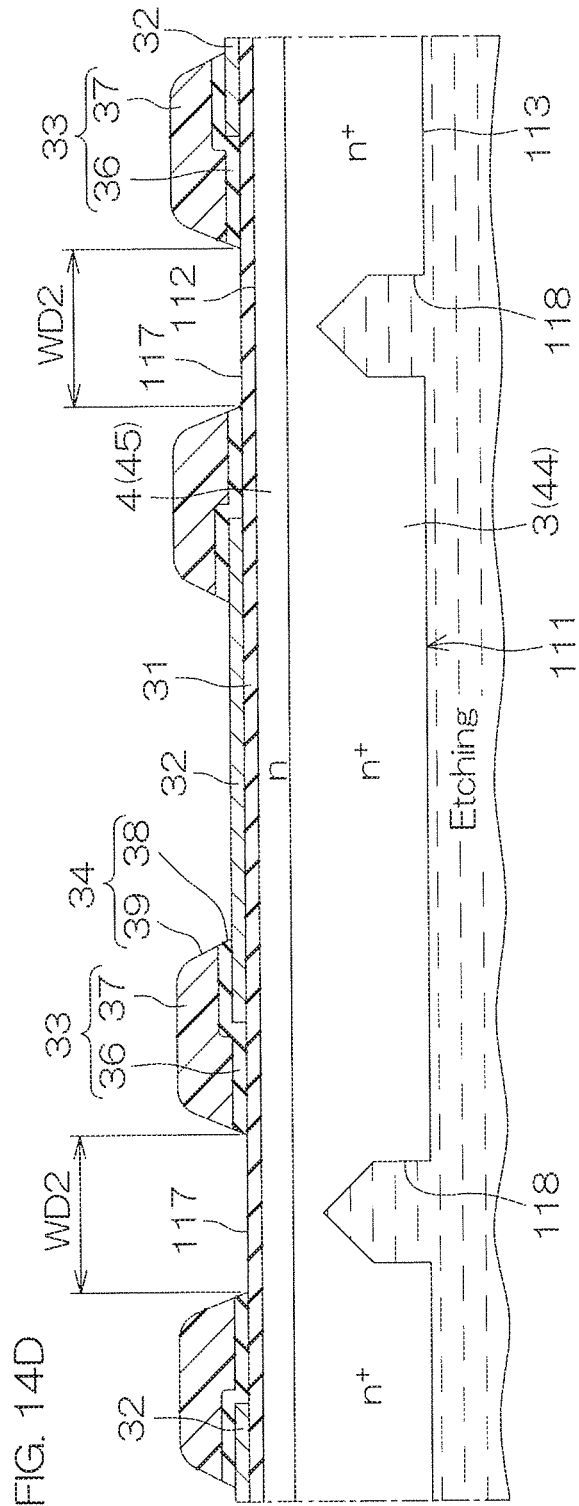

Referring to FIG. 14D, the second wafer principal surface 113 and the inner wall of the groove 118 may be roughened by a roughening etching method. The roughening etching method may be a wet etching method and/or a dry etching method. The roughening etching method is preferably a wet etching method.

Referring to FIG. 14E, the base metal layer 120 that is to be the base of the first metal layer 21 and the second metal layer 27 is formed on the second wafer principal surface 113. The base metal layer 120 is formed as a film along the second wafer principal surface 113 and the inner wall of the groove 118. The base metal layer 120 thereby demarcates the recess space inside the groove 118.

In this embodiment, the base metal layer 120 has the laminated structure that includes the Ti layer 22, the Ni layer 23, the Au layer 24, the Pd layer 25, and the Ag layer 26. The Ti layer 22, the Ni layer 23, the Au layer 24, the Pd layer 25, and the Ag layer 26 may each be formed by a sputter method, a vapor deposition method, and/or a plating method.

The base metal layer 120 covers the second wafer principal surface 113 and the inner wall of the groove 118 that have been roughened. The adhesion force of the base metal layer 120 to the second wafer principal surface 113 and the inner wall of the groove 118 can thereby be increased and peeling of the base metal layer 120 from the second wafer principal surface 113 and the inner wall of the groove 118 can thus be suppressed appropriately.

Figure 14F:
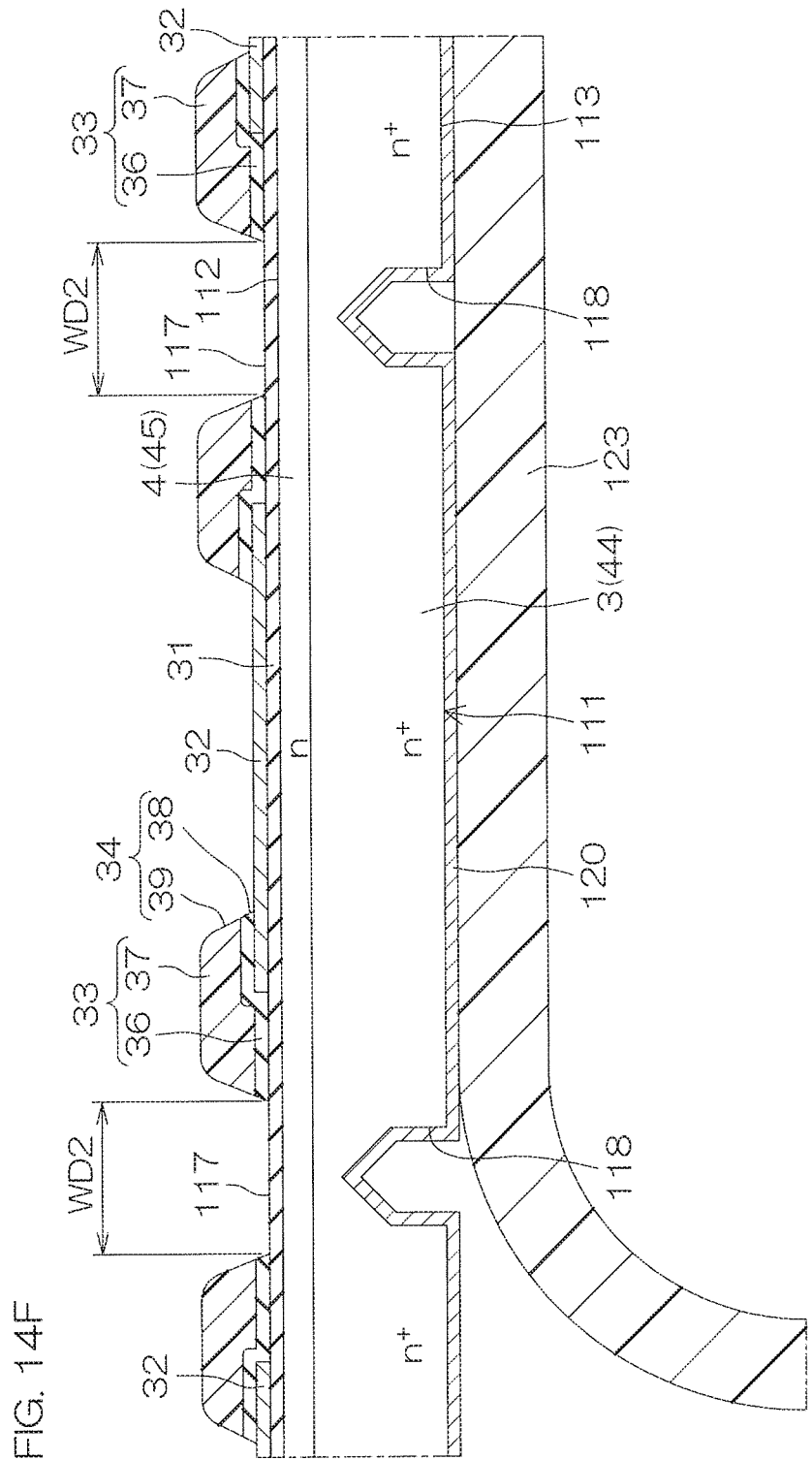

Referring to FIG. 14F, a second support tape 123 is stuck onto the second wafer principal surface 113 side (specifically, the base metal layer 120). The second support tape 123 is preferably constituted of an ultraviolet curable one-sided tacky tape. The second support tape 123 may, for example, be a dicing tape that includes a base film including an ultraviolet transmitting resin and a tacky agent layer provided at one surface side of the base film and including an ultraviolet curable resin.

Figure 14G:
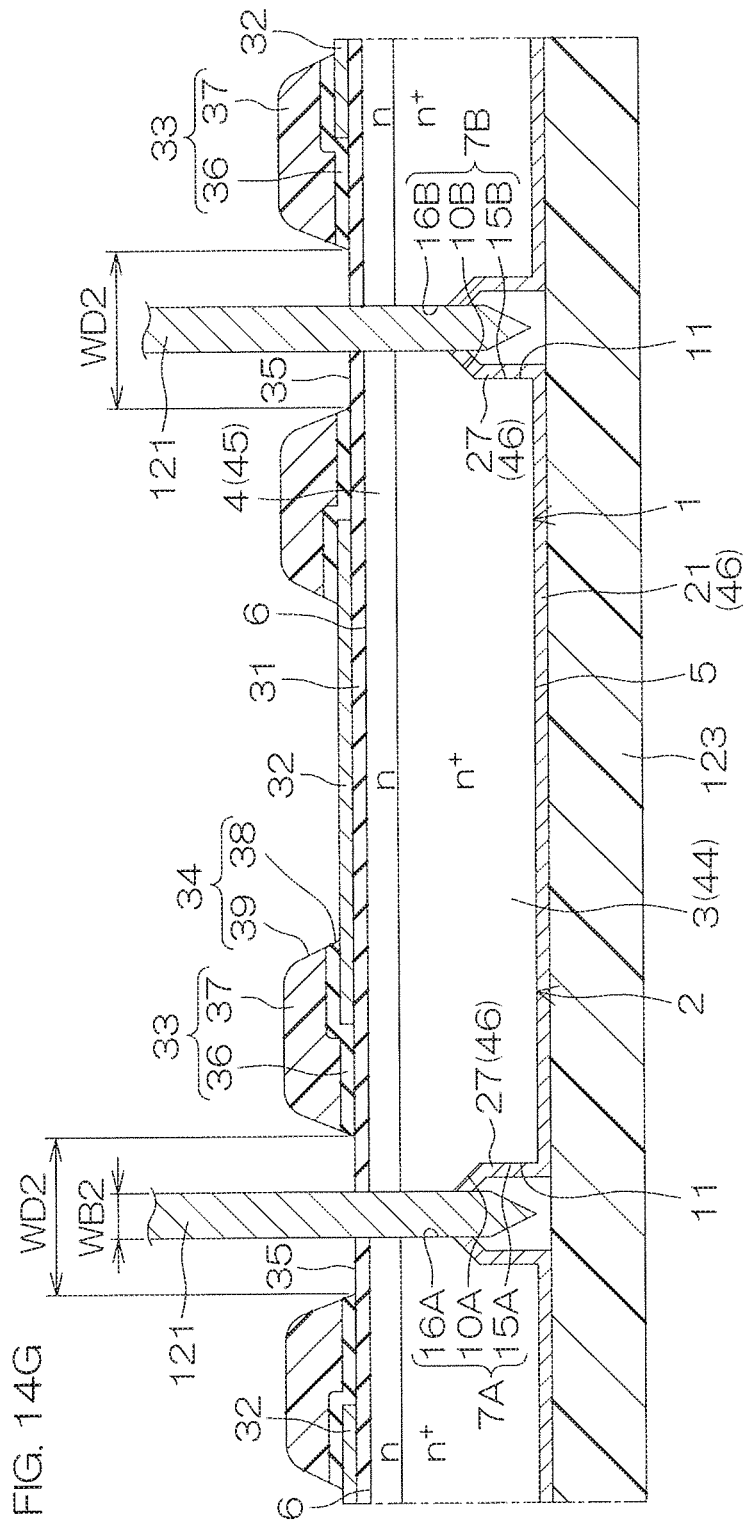

Referring to FIG. 14G, in a state where the wafer 111 is supported by the second support tape 123, the wafer 111 is cut along the dicing street 117 from the first wafer principal surface 112 side and divided into the plurality of the semiconductor devices 1. In this step, the wafer 111 is cut by the grinding method using the second blade 121 having the second blade width WB2 less than the first blade width WB1.

After the wafer 111 is cut, ultraviolet rays are irradiated onto the second support tape 123 and a tacky adhesive force of the second support tape 123 is decreased. Thereafter, the plurality of semiconductor devices 1 are picked up from the second support tape 123. In this process, the first metal layer 21 and the second metal layer 27 cover the second wafer principal surface 113 and the inner wall of the groove 118 that have been roughened. Peeling off of the first metal layer 21 and the second metal layer 27 that accompanies the picking up of the semiconductor devices 1 can thus be suppressed.

Figure 15A:
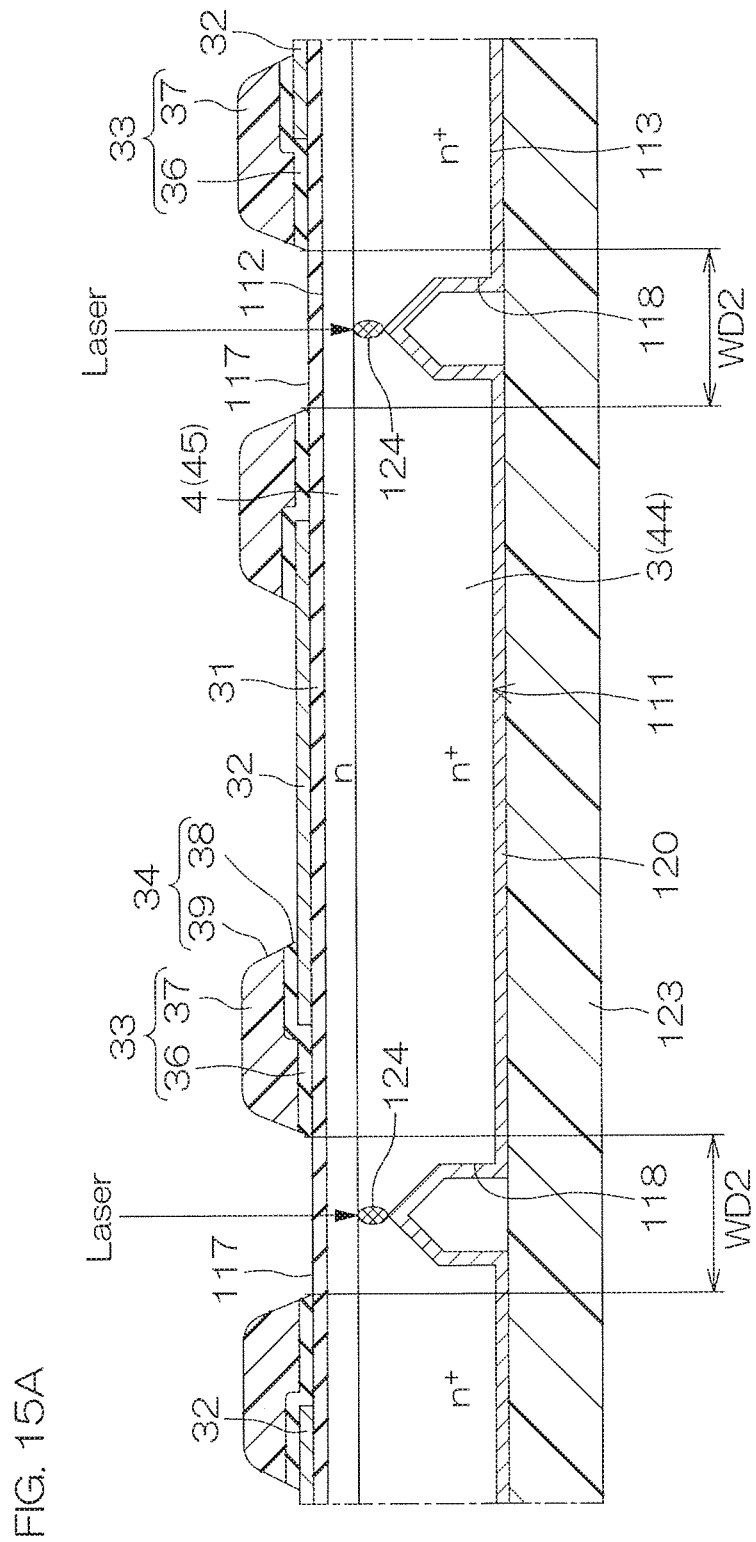
FIG. 15A and FIG. 15B are sectional views of steps after FIG. 14F and are sectional views for describing another method for cutting a wafer.
Figure 15B:
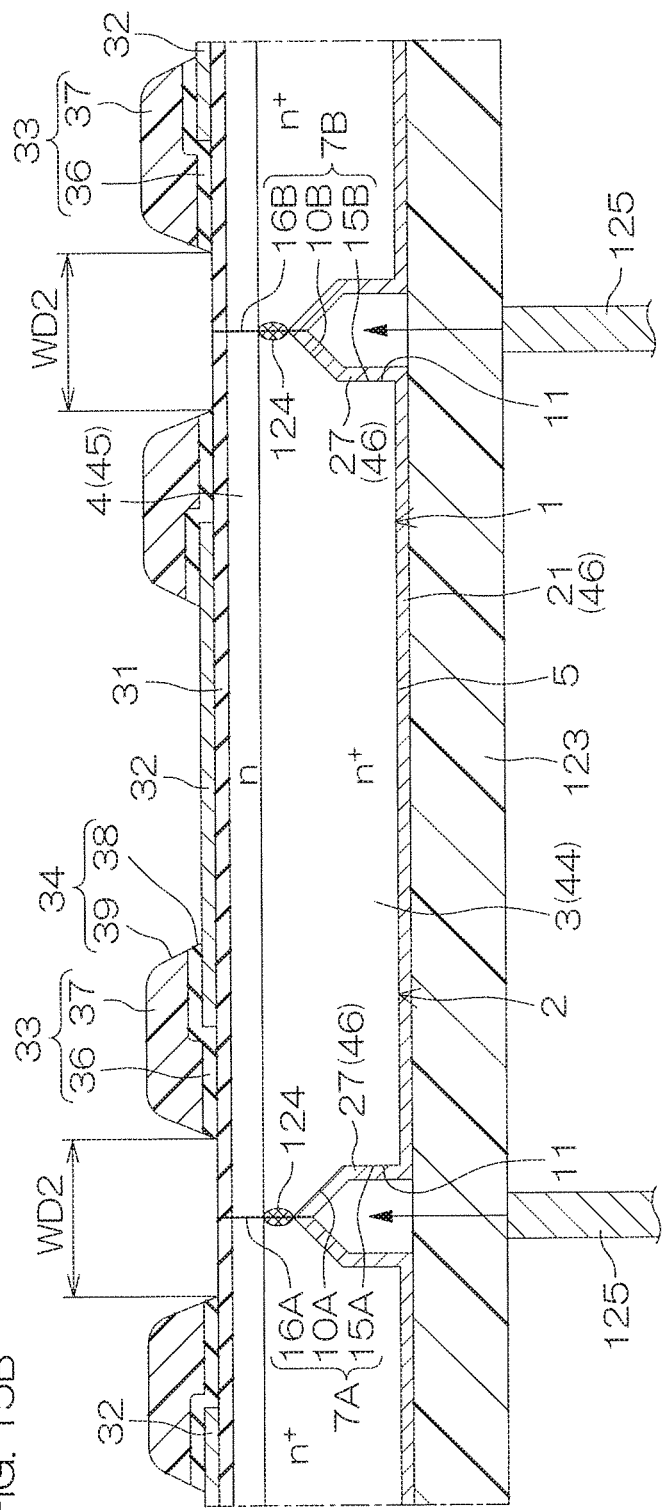

Besides the cutting method using the second blade 121, the wafer 111 may be cut by a cutting method shown in FIG. 15A and FIG. 15B. FIG. 15A and FIG. 15B are sectional views of steps from FIG. 14F onward and are sectional views for describing another method for cutting the wafer 111.

Referring to FIG. 15A, after sticking on the second support tape 123, laser light from a laser light irradiating apparatus (not shown) is irradiated into an interior of the wafer 111 via the dicing street 117. The laser light is preferably irradiated in pulses into the interior of the wafer 111 from the first wafer principal surface 112 side that does not have the base metal layer 120. A light converging portion (focal point) of the laser light is set in the interior (thickness direction intermediate portion) of the wafer 111 and an irradiation position of the laser light is moved along the dicing street 117.

A modified layer 124 extending along the dicing street 117 and the groove 118 in plan view is thereby formed in the interior of the wafer 111. The modified layer 124 is constituted of a laser light irradiation mark and is constituted of a region with which a crystal structure of the wafer 111 has been modified to be of altered property. That is, the modified layer 124 is constituted of a region with which density, refractive index, mechanical strength (crystal strength), or other physical characteristic has been modified to a property differing from that of the crystal structure of the wafer 111.

The modified layer 124 may include at least one of an amorphous layer, a melt rehardened layer, a defect layer, a dielectric breakdown layer, and a refractive index change layer. The amorphous layer is a layer in which a portion of the wafer 111 is made amorphous. The melt rehardened layer is a layer in which a portion of the wafer 111 is rehardened after being melted. The defect layer is a layer that includes a hole, a crack, etc., formed in the wafer 111. The dielectric breakdown layer is a layer in which a portion of the wafer 111 has undergone dielectric breakdown. The refractive index change layer is a layer in which a portion of the wafer 111 has changed to a refractive index differing from the wafer 111.

The modified layer 124 has a planar shape conforming to planar shapes of the dicing street 117 and the groove 118 in plan view. That is, the modified layer 124 is formed in a lattice in plan view. The modified layer 124 is formed in a region of the interior of the wafer 111 that faces the dicing street 117 and the groove 118. The modified layer 124 is preferably formed in a region that faces a central portion of the groove 118 in plan view. A width of the modified layer 124 is preferably less than the width WD2 of the dicing street 117. Also, the width of the modified layer 124 is especially preferably less than a width of the groove 118 (equivalent to the width of the first blade width WB1).

The modified layer 124 is preferably formed at intervals from the first wafer principal surface 112 and the groove 118 in the interior of the wafer 111. In this case, the modified layer 124 is preferably formed in a portion of the interior of the wafer 111 that is constituted of the substrate 3 (drain region 44). The modified layer 124 is especially preferably formed in a portion of the interior of the wafer 111 constituted of the substrate 3 at an interval from the epitaxial layer 4 (drift region 45). Most preferably, the modified layer 124 is not formed in the epitaxial layer 4 in the interior of the wafer 111.

Referring to FIG. 15B, an external force is applied to the wafer 111 and the wafer 111 is cleaved with the modified layer 124 as a starting point. The interlayer insulating layer 31 and the base metal layer 120 are cleaved at the same time as the cleavage of the wafer 111. The top insulating layers 33 demarcate the dicing street 117 and are not positioned on a cleavage line and are therefore prevented from being cleaved. If the top insulating layers 33 that include the resin layers 37 are arranged on the cleavage line, cleavage is prevented by elasticity of the resin layers 37. Therefore, with the cleaving step according to this embodiment, the cleaving of the wafer 111 can be performed smoothly.

Also, in this embodiment, a pressing member 125 applies the external force to the wafer 111 from the second wafer principal surface 113 side via the second support tape 123. By this method, in cleaving the wafer 111, the plurality of semiconductor devices 1 can be inclined in directions of separating from each other with the pressing member 125 as a starting point. Collision of the plurality of semiconductor devices 1 with each other due to the cleaving can thus be suppressed. Cracking of the semiconductor devices 1 can thereby be suppressed.

After the wafer 111 is cleaved, ultraviolet rays are irradiated onto the second support tape 123 and the tacky adhesive force of the second support tape 123 is decreased. Thereafter, the plurality of semiconductor devices 1 are picked up from the second support tape 123. In this process, the first metal layer 21 and the second metal layer 27 cover the second wafer principal surface 113 and the inner wall of the groove 118 that have been roughened. Peeling off of the first metal layer 21 and the second metal layer 27 that accompanies the picking up of the semiconductor devices 1 can thus be suppressed.

FIG. 16 corresponds to FIG. 4 and is a sectional view of the semiconductor device 1 manufactured through the steps of FIG. 15A and FIG. 15B. In the following, structures that have been mentioned already are provided with the reference signs and description thereof is omitted.

Referring to FIG. 16, in the semiconductor device 1, the side walls 7A to 7D have cleavage surfaces in regions between the non-mounting surface 6 and the eaves portions 10A to 10D. That is, the side walls 7A to 7D have the notched portions 11 at the mounting surface 5 side and cleaved portions 126 at the non-mounting surface 6 side. The notched portions include the eaves portions 10A to 10D and the first connecting walls 15A to 15D and are recessed toward the non-mounting surface 6 from the mounting surface 5. The cleaved portions 126 include the second connecting walls 16A to 16D and are formed in regions between the non-mounting surface 6 and the notched portions 11.

In this structure, the semiconductor device 1 includes the modified layers 124 formed in the cleaved portions 126 of the side walls 7A to 7D. That is, the modified layers 124 are formed in the head portion 18 of the chip 2. The modified layers 124 are preferably formed in the side walls 7A to 7D at intervals from the non-mounting surface 6 and the notched portions 11 (eaves portions 10A to 10D). The modified layers 124 are preferably formed in portions of the side walls 7A to 7D that are constituted of the substrate 3 (drain region 44).

In this case, the modified layers 124 are especially preferably formed in portions of the side walls 7A to 7D constituted of the substrate 3 at an interval from the epitaxial layer 4 (drift region 45). Most preferably, the modified layers 124 are not formed in the epitaxial layer 4 in the side walls 7A to 7D. The width of the modified layers 124 are preferably less than the width WE of the eaves portions 10A to 10D.

In the second metal layer 27, the exposed portion 30 of second covering portion 29 is constituted of the cleavage surfaces in this embodiment. The exposed portion 30 of the second covering portion 29 form a single cleavage surface (cleaved portion) with the cleaved portions 126 of the side walls 7A to 7D, respectively. Also, in this embodiment, the peripheral edges of the interlayer insulating layer 31 are constituted of cleavage surfaces. The peripheral edges of the interlayer insulating layer 31 form a single cleavage surface (cleaved portion) with the cleaved portions 126 of the side walls 7A to 7D.

As described above, according to this manufacturing method, the modified layer 124 is formed in the portion of the interior of the wafer 111 that has been thinned by the groove 118 and the wafer 111 is cleaved with the modified layer 124 as the starting point. The portion of the wafer 111 to be cleaved is thereby made small and therefore, risk of occurrence of cracking due to cleaving can be reduced. An appearance defect of the semiconductor device 1 can thus be suppressed.

Also, by the cleaving step of the wafer 111, use of the second blade 121 is made unnecessary. Wear of the second blade 121 can thus be prevented. Also, a process margin of the second blade 121 can be eliminated and a portion of the wafer 111 that is lost by grinding (that is, a cutting margin) can be eliminated. The number of the semiconductor devices 1 obtainable from a single wafer 111 can thereby be increased.

Also, according to this manufacturing method, an irradiation range of the laser light with respect to the wafer 111 can be narrowed by the groove 118 and an irradiation time of the laser can thus be shortened. The wafer 111 can thus be cleaved smoothly. From the above, it can be said that the wafer 111 having the groove 118 is extremely high in affinity with the cleaving step.

The modified layer 124 is preferably formed at an interval to the first wafer principal surface 112 (non-mounting surface 6) side from the groove 118 (notched portions 11). In this case, cracking of the groove 118 (notched portions 11) due to the modified layer 124 during cleaving can be suppressed. Also, the modified layer 124 is preferably formed at an interval to the groove 118 (notched portions 11) side from the first wafer principal surface 112 (non-mounting surface 6). In this case, cracking at corner portions of the chip 2 as viewed in cross section during cleaving can be suppressed. The width of the modified layer 124 formed in the wafer 111 is preferably less than the width of the groove 118 (equivalent to the width of the first blade width WB1). In this case, damage of the wafer 111 can be reduced and risk of occurrence of cracking at the groove 118 (notched portion 11) can thus be reduced.

The epitaxial layer 4 has the device surface (non-mounting surface 6) at which the functional devices are formed, and if the modified layer 124 is formed in the epitaxial layer 4, a portion of the epitaxial layer will be altered due to the modified layer 124 and this cannot be said to be preferable in view of the physical characteristics and electrical characteristics of the epitaxial layer 4.

Therefore, the light converging portion (focal point) of the laser light is preferably set at a portion of the wafer 111 constituted of the substrate 3 (drain region 44). That is, the modified layer 124 is preferably formed in the portion of the wafer 111 constituted of the substrate 3 (drain region 44). Variations in the physical characteristics and electrical characteristics of the epitaxial layer 4 due to the modified layer 124 can thereby be suppressed. Consequently, variations in the electrical characteristics of the functional devices formed in the epitaxial layer 4 can also be suppressed.

In this case, the modified layer 124 is especially preferably formed in a portion of the interior of the wafer 111 constituted of the substrate 3 at an interval from the epitaxial layer 4 (drift region 45). Most preferably, the modified layer 124 is not formed in the epitaxial layer 4 in the interior of the wafer 111. Obviously, this disclosure does not prevent a structure in which the modified layer 124 is formed in the epitaxial layer 4, and the modified layer 124 may be formed as necessary in the epitaxial layer 4.

The preferred embodiment of the present invention can also be implemented in yet other embodiments.

With the preferred embodiment described above, an example where the side walls 7A to 7D have the eaves portions 10A to 10D, respectively was described. However, a structure where one, two, or three of the side walls 7A to 7D does or do not have the eaves portions 10A to 10D may be adopted. Such a structure is formed by omitting a portion of the step of forming the groove 118. However, in view of symmetry, heat dissipation, etc., of the chip 2, it is preferable for all of the side walls 7A to 7D to have the eaves portions 10A to 10D.

With the preferred embodiment described above, an example where the mounting surface 5, the eaves portions 10A to 10D, and the first connecting walls 15A to 15D are constituted of rough surfaces was described. However, the mounting surface 5, the eaves portions 1OA to 10D, and the first connecting walls 15A to 15D do not have to be roughened. In this case, the step of FIG. 13J is omitted. When the step of FIG. 13J is omitted, at least the mounting surface 5 is constituted of a ground surface having grinding marks. If the grove 118 is formed by the first blade 119 in the step of FIG. 13I, the eaves portions 10A to 10D and the first connecting walls 15A to 15D that are constituted of ground surfaces having grinding marks are formed.

With the preferred embodiment described above, an example where the top insulating layer 33 has the laminated structure that includes the passivation layer 36 and the resin layer 37 was described. However, the top insulating layer 33 may have a single layer structure constituted of the passivation layer 36 or the resin layer 37.

With the preferred embodiment described above, an example where the embedded electrode 85 has the dielectric isolation type electrode structure that includes the bottom side electrode 88, the opening side electrode 89, and the intermediate insulating layer 90 was described. However, the embedded electrode 85 may be embedded as an integral object in the gate trench 83 across the insulating layer 84. In this case, the insulating layer 84 may have a uniform thickness.

In the preferred embodiment described above, a structure with which the conductivity types of the respective semiconductor portions are inverted may be adopted. That is, a p-type portion may be made to be of an n-type and an n-type portion may be made to be of a p-type.

With the preferred embodiment described above, an example where the chip 2 that is made of silicon is adopted was described. However, in the preferred embodiment described above, the chip 2 that is made of a wide band gap semiconductor material may be adopted. In this case, the chip 2 that is made of silicon carbide may be adopted. Also, in the preferred embodiment described above, the chip 2 that is made of a compound semiconductor material may be adopted. In this case, the chip 2 that is made of gallium nitride or gallium oxide may be adopted.

With the preferred embodiment described above, an example where the functional devices that include the vertical type device (power MISFET 43) are formed in the chip 2 having the eaves portions 10A to 10D was described. However, a functional device that includes a lateral type device may be formed in the chip 2 having the eaves portions 10A to 10D. Also, just a functional device constituted of a lateral type device may be formed in the chip 2 having the eaves portions 10A to 10D.

With the preferred embodiment described above, an example where the functional devices are IPD was described. However, the functional devices are not restricted to IPD. The chip 2 having the eaves portions 10A to 10D can be applied to various electronic components (semiconductor devices) provided with functional devices other than IPD. For example, the chip 2 having the eaves portions 10A to 10D can be applied to an electronic component (semiconductor device), etc., provided with at least one of a passive device, a semiconductor passive device, a semiconductor rectifying device, a semiconductor light emitting device, and a semiconductor switching device.

The passive device (semiconductor passive device) may include at least one of a resistor, a capacitor, and a coil. The semiconductor rectifying device may include at least one of a pn-junction diode, a Zener diode, a Schottky barrier diode, and a first recovery diode. The semiconductor light emitting device may include at least one of a light emitting diode, a semiconductor laser, and an organic electroluminescence device.

The semiconductor switching device may include at least one of a JFET (junction field effect transistor), a BJT (bipolar junction transistor), a MISFET (metal insulator field effect transistor), and an IGBT (insulated gate bipolar junction transistor).

The functional device may include a circuit network in which at least two of the passive device (semiconductor passive device), the semiconductor rectifying device, and the semiconductor switching device are combined. The circuit network may form a portion or an entirety of an integrated circuit. The integrated circuit may include an SSI (small scale integration), an LSI (large scale integration), an MSI (medium scale integration), a VLSI (very large scale integration), or an ULSI (ultra-very large scale integration).

Examples of features extracted from the present description and drawings are indicated below.

Heat dissipation of a semiconductor device can be improved by forming a metal layer on a side wall of a chip. However, in this case, undesirable short circuiting is likely to be caused as a result of a conductive bonding material flowing around via the metal layer to a non-mounting surface of the chip. Consequently, heat dissipation cannot be improved appropriately. Thus, the following [A1] to [A19] provide a semiconductor device with which heat dissipation can be improved appropriately.

[A1] A semiconductor device comprising: a chip that includes a mounting surface, a non-mounting surface protruding further outward than the mounting surface, and a side wall having an eaves portion that protrudes further outward than the mounting surface and connecting the mounting surface and the non-mounting surface; a first metal layer that covers the mounting surface; and a second metal layer that covers the side wall at an interval to the mounting surface side from the non-mounting surface. According to this semiconductor device, flowing around of a conductive bonding material to the non-mounting surface can be suppressed by the eaves portion. A semiconductor device with which heat dissipation can be improved appropriately can thus be provided.

[A2] The semiconductor device according to A1, wherein the eaves portion is formed at an interval to the mounting surface side from the non-mounting surface.

[A3] The semiconductor device according to A1 or A2, wherein the second metal layer covers a region in the side wall between the mounting surface and the eaves portion.

[A4] The semiconductor device according to any one of A1 to A3, wherein the second metal layer covers the eaves portion.

[A5] The semiconductor device according to any one of A1 to A4, wherein the eaves portion has an inner end portion at the mounting surface side, an outer end portion at the non-mounting surface side, and a connecting portion connecting the inner end portion and the outer end portion.

[A6] The semiconductor device according to A5, wherein the connecting portion is constituted of an inclined portion.

[A7] The semiconductor device according to any one of A1 to A6, wherein the side wall has a connecting wall that connects the non-mounting surface and the eaves portion and the second metal layer exposes the connecting wall.

[A8] The semiconductor device according to any one of A1 to A7, wherein the chip has a laminated structure that includes a substrate forming the mounting surface and an epitaxial layer forming the non-mounting surface and the eaves portion is formed on the substrate.

[A9] The semiconductor device according to A8, wherein the eaves portion is formed in the substrate at an interval from the epitaxial layer.

[A10] The semiconductor device according to A8 or A9, wherein the second metal layer exposes the epitaxial layer.

[A11] The semiconductor device according to any one of A1 to A10, wherein the eaves portion is formed by a notched portion with which a peripheral edge portion of the mounting surface is notched toward the non-mounting surface.

[A12] The semiconductor device according to any one of A1 to A11, wherein the first metal layer includes a noble metal.

[A13] The semiconductor device according to any one of A1 to A12, wherein the second metal layer includes a noble metal.

[A14] A semiconductor package comprising: a die pad; a lead terminal arranged at an interval from the die pad; the semiconductor device according to any one of A1 to A13 arranged on the die pad in an orientation where the mounting surface faces the die pad; and a conductive bonding material interposed between the first metal layer and the die pad, covering the second metal layer, and bonding the semiconductor device to the die pad.

[A15] The semiconductor package according to A14, wherein the conductive bonding material covers the second metal layer at an interval to the mounting surface side from the non-mounting surface.

[A16] The semiconductor package according to A14 or A15, wherein the conductive bonding material covers the eaves portion.

[A17] The semiconductor package according to any one of A14 to A16, wherein the conductive bonding material is constituted of solder or conductive paste.

[A18] The semiconductor package according to A17, wherein the conductive bonding material is constituted of silver paste.

[A19] The semiconductor package according to any one of A14 to A18, further comprising: a package main body constituted of a resin; and wherein the die pad, the lead terminal, the semiconductor device, and the conductive bonding material are arranged inside the package main body.

The following [B1] to [B20] provide a semiconductor device with which flowing around of a conductive bonding material can be suppressed.

[B1] A semiconductor device (1) comprising: a semiconductor chip (2) that includes a first surface (5), a second surface (6), and a side wall (7A to 7D) connecting the first surface (5) and the second surface (6) and has a notched portion (11) recessed from the first surface (5) toward the second surface (6) in the side wall (7A to 7D) and a cleaved portion (16A to 16D, 126) formed between the second surface (6) and the notched portion (11) at the side wall (7A to 7D); and a modified layer (124) that is formed in the cleaved portion (16A to 16D, 126) at the side wall (7A to 7D) and modified to be of a property differing from that of a crystal structure of the semiconductor chip (2). According to this semiconductor device (1), flowing around of a conductive bonding material to the second surface (6) can be suppressed by the notched portion (11).

[B2] The semiconductor device (1) according to B1, wherein the modified layer (124) is formed at an interval to the notched portion (11) side from the second surface (6).

[B3] The semiconductor device (1) according to B1 or B2, wherein the modified layer (124) is formed at an interval to the second surface (6) side from the notched portion (11).

[B4] The semiconductor device (1) according to any one of B1 to B3, wherein, in regard to a planar direction along the first surface (5), the modified layer (124) has a width less than a width (WE) of the notched portion (11).

[B5] The semiconductor device (1) according to any one of B1 to B4, further comprising: a metal layer (21) that covers the first surface (5).

[B6] The semiconductor device (1) according to any one of B1 to B5, further comprising: a side wall metal layer (22) that covers the notched portion (11).

[B7] The semiconductor device (1) according to B6, wherein the side wall metal layer (22) exposes the cleaved portion (16A to 16D, 126).

[B8] The semiconductor device (1) according to any one of B1 to B7, wherein the first surface (5) is a mounting surface (5), and the second surface (6) is a non-mounting surface (6).

[B9] A semiconductor device (1) comprising: a semiconductor chip (2) that has a laminated structure including a semiconductor substrate (3) and an epitaxial layer (4), has a first surface (5) at the semiconductor substrate (3) side, a second surface (6) at the epitaxial layer (4) side, and a side wall (7A to 7D) formed by the semiconductor substrate (3) and the epitaxial layer (4), and has a notched portion (11) recessed from the first surface (5) toward the second surface (6) in the side wall (7A to 7D) and a cleaved portion (16A to 16D, 126) formed between the second surface (6) and the notched portion (11) at the side wall (7A to 7D); and a modified layer (124) that is formed in the cleaved portion (16A to 16D, 126) at the side wall (7A to 7D) and modified to be of a property differing from that of a crystal structure of the semiconductor chip (2). According to this semiconductor device (1), flowing around of a conductive bonding material to the second surface (6) can be suppressed by the notched portion (11).

[B10] The semiconductor device (1) according to B9, wherein the notched portion (11) is formed from the first surface (5) toward the second surface (6) and up to a thickness direction intermediate portion of the semiconductor substrate (3), and the cleaved portion (16A to 16D, 126) is formed by the semiconductor substrate (3) and the epitaxial layer (4).

[B11] The semiconductor device (1) according to B9 or B10, wherein the modified layer (124) is formed at an interval to the notched portion (11) side from the second surface (6).

[B12] The semiconductor device (1) according to any one of B9 to B11, wherein the modified layer (124) is formed at an interval to the second surface (6) side from the notched portion (11).

[B13] The semiconductor device (1) according to any one of B9 to B12, wherein the modified layer (124) is formed in a portion of the side wall (7A to 7D) constituted of the semiconductor substrate (3).

[B14] The semiconductor device (1) according to any one of B9 to B13, wherein the modified layer (124) is formed in a portion of the side wall (7A to 7D) constituted of the semiconductor substrate (3) at an interval to the notched portion (11) side from the epitaxial layer (4).

[B15] The semiconductor device (1) according to any one of B9 to B14, wherein, in regard to a planar direction along the first surface (5), the modified layer (124) has a width less than a width (WE) of the notched portion (11).

[B16] The semiconductor device (1) according to any one of B9 to B15, further comprising: a metal layer (21) that covers the first surface (5).

[B17] The semiconductor device (1) according to any one of B9 to B16, further comprising: a side wall metal layer (22) that covers the side wall (7A to 7D).

[B18] The semiconductor device (1) according to B17, wherein the side wall metal layer (22) covers the notched portion (11) and exposes the cleaved portion (16A to 16D, 126).

[B19] The semiconductor device (1) according to B17 or B18, wherein the side wall metal layer (22) covers a portion of the side wall (7A to 7D) constituted of the semiconductor substrate (3) at an interval to the notched portion (11) side from the epitaxial layer (4).

[B20] The semiconductor device (1) according to any one of B9 to B19, wherein the first surface (5) is a mounting surface (5) and the second surface (6) is a non-mounting surface (6).

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A semiconductor device comprising:
    a chip that includes a mounting surface, a non-mounting surface, and a side wall connecting the mounting surface and the non-mounting surface and has an eaves portion protruding further outward than the mounting surface at the side wall; and
    a first metal layer that covers an entirety of the mounting surface,
        wherein the eaves portion has an inner end portion located closer to the mounting surface side in a direction Z that is normal to the mounting surface, an outer end portion located closer to the non-mounting surface side in the normal direction Z, and a connecting portion connecting between the inner end portion and the outer end portion, and
        wherein the connecting portion has an inclined surface that forms an obtuse angle with the side wall at the inner end portion and at the outer end portion.

2. The semiconductor device according to claim 1, wherein the non-mounting surface protrudes further outward than the mounting surface and the eaves portion under a circumference portion of the non-mounting surface in a thickness direction of the chip.

3. The semiconductor device according to claim 1, further comprising:
    a side wall metal layer that covers the side wall below the eaves portion.

4. The semiconductor device according to claim 3, wherein the side wall metal layer is formed at an interval to the mounting surface side from the non-mounting surface.

5. The semiconductor device according to claim 3, wherein the side wall metal layer covers a region of the side wall between the mounting surface and the eaves portion.

6. The semiconductor device according to claim 3, wherein the side wall metal layer covers the side wall under the eaves portion.

7. The semiconductor device according to claim 3, wherein the side wall has a connecting wall connecting the non-mounting surface and the eaves portion and the side wall metal layer exposes the connecting wall.

8. The semiconductor device according to claim 3, wherein the side wall metal layer includes a noble metal.

9. The semiconductor device according to claim 1, wherein the first metal layer includes a noble metal.

10. A semiconductor package comprising:
    a die pad;
    a lead terminal arranged at an interval from the die pad;
    the semiconductor device according to claim 1 arranged on the die pad in an orientation where the mounting surface faces the die pad; and
    a conductive bonding material interposed between the metal layer and the die pad and bonding the semiconductor device to the die pad at an interval to the mounting surface side from the non-mounting surface.

11. The semiconductor package according to claim 10, wherein the conductive bonding material covers the eaves portion.

12. The semiconductor device according to claim 1, further comprising:
    an interlayer insulating layer that covers the non-mounting surface, the interlayer insulating layer having a peripheral edge that is formed flush with the side wall.

13. A semiconductor device comprising:
    a chip that has a laminated structure including a semiconductor substrate and an epitaxial layer, has a mounting surface at the semiconductor substrate side, a non-mounting surface at the epitaxial layer side, and a side wall formed by the semiconductor substrate and the epitaxial layer, and has an eaves portion protruding further outward than the mounting surface at a portion of the side wall constituted of the semiconductor substrate; and
    a first metal layer that covers an entirety of the mounting surface,
        wherein the eaves portion has an inner end portion located closer to the mounting surface side in a direction Z that is normal to the mounting surface, an outer end portion located closer to the non-mounting surface side in the normal direction Z, and a connecting portion connecting between the inner end portion and the outer end portion, and
        wherein the connecting portion has an inclined surface that forms an obtuse angle with the side wall at the inner end portion and at the outer end portion.

14. The semiconductor device according to claim 13, wherein the non-mounting surface protrudes further outward than the mounting surface, and the eaves portion under a circumference portion of the non-mounting surface in a thickness direction of the chip.

15. The semiconductor device according to claim 13, wherein the eaves portion is formed at a portion of the side wall constituted of the semiconductor substrate at an interval to the mounting surface side from the epitaxial layer.

16. The semiconductor device according to claim 13, further comprising:
    a side wall metal layer that covers the side wall below the eaves portion.

17. The semiconductor device according to claim 13, wherein the side wall metal layer is formed at an interval to the mounting surface side from the non-mounting surface.

18. The semiconductor device according to claim 16, wherein the side wall metal layer covers a portion of the side wall constituted of the semiconductor substrate at an interval to the mounting surface side from the epitaxial layer.

19. The semiconductor device according to claim 16, wherein the side wall metal layer exposes the epitaxial layer.

20. The semiconductor device according to claim 16, further comprising:
    a functional device formed in the epitaxial layer.

* * * * *